United States Patent
Jaiswal et al.

(10) Patent No.: US 11,195,580 B2
(45) Date of Patent: Dec. 7, 2021

(54) INTEGRATED PIXEL AND TWO-TERMINAL NON-VOLATILE MEMORY CELL AND AN ARRAY OF CELLS FOR DEEP IN-SENSOR, IN-MEMORY COMPUTING

(71) Applicant: GLOBALFOUNDRIES U.S. Inc., Malta, NY (US)

(72) Inventors: Akhilesh Jaiswal, Falls Church, VA (US); Ajey Poovannummoottil Jacob, Watervliet, NY (US)

(73) Assignee: GLOBALFOUNDRIES U.S. Inc., Malta, NY (US)

(*) Notice: Subject to any disclaimer, the term of this patent is extended or adjusted under 35 U.S.C. 154(b) by 63 days.

(21) Appl. No.: 16/801,458

(22) Filed: Feb. 26, 2020

(65) Prior Publication Data

US 2021/0264973 A1 Aug. 26, 2021

(51) Int. Cl.
*G11C 11/00* (2006.01)
*G11C 13/00* (2006.01)
(Continued)

(52) U.S. Cl.
CPC .......... *G11C 13/004* (2013.01); *G06F 7/5443* (2013.01); *G11C 11/161* (2013.01);
(Continued)

(58) Field of Classification Search
CPC . G11C 13/004; G11C 11/161; G11C 11/1655; G11C 11/1657; G11C 11/1673;
(Continued)

(56) References Cited

U.S. PATENT DOCUMENTS 6,914,227 B2* 7/2005 Kaifu .................. H04N 3/1562
250/208.1
7,119,745 B2 10/2006 Gaucher et al.
(Continued)

FOREIGN PATENT DOCUMENTS

WO      95/06288 A2    3/1995
WO   2011/133693 A2   10/2011

OTHER PUBLICATIONS

Coath et al., "Advanced Pixel Architectures for Scientific Image Sensors", Research Gate, 2009, pp. 57-61, https://www.researchgate.net/publication/265117870.
(Continued)

*Primary Examiner* — Viet Q Nguyen
(74) *Attorney, Agent, or Firm* — Gibb & Riley, LLC; Francois Pagette

(57) ABSTRACT

Disclosed is a cell that integrates a pixel and a two-terminal non-volatile memory device. The cell can be selectively operated in write, read and functional computing modes. In the write mode, a first data value is stored the memory device. In the read mode, it is read from the memory device. In the functional computing mode, the pixel captures a second data value and a sensed change in an electrical parameter (e.g., voltage or current) on a bitline connected to the cell is a function of both the first and second data value. Also disclosed is an IC structure that includes an array of the cells and, when multiple cells in a given column are concurrently operated in the functional computing mode, the sensed total change in the electrical parameter on the bitline for the column is indicative of a result of a dot product computation.

20 Claims, 19 Drawing Sheets

(51) Int. Cl.
  *G11C 11/16* (2006.01)
  *G06F 7/544* (2006.01)
(52) U.S. Cl.
  CPC ...... *G11C 11/1655* (2013.01); *G11C 11/1657* (2013.01); *G11C 11/1673* (2013.01); *G11C 11/1675* (2013.01); *G11C 11/1697* (2013.01); *G11C 13/0004* (2013.01); *G11C 13/0026* (2013.01); *G11C 13/0028* (2013.01); *G11C 13/0038* (2013.01); *G11C 13/0069* (2013.01); *G11C 2013/0045* (2013.01); *G11C 2013/0078* (2013.01)
(58) Field of Classification Search
  CPC ............ G11C 11/1675; G11C 11/1697; G11C 13/0004; G11C 13/0026; G11C 13/0028; G11C 13/0038; G11C 13/0069; G06F 7/5443
  USPC ........................................................ 365/148
  See application file for complete search history.

(56) References Cited

U.S. PATENT DOCUMENTS

| | | | | |
|---|---|---|---|---|
| 7,514,716 | B2* | 4/2009 | Panicacci | H04N 5/3535 257/72 |
| 7,692,130 | B2* | 4/2010 | Abadeer | H04N 5/374 250/208.1 |
| 7,952,635 | B2* | 5/2011 | Lauxtermann | H04N 5/3559 348/308 |
| 8,018,384 | B2 | 9/2011 | Floyd et al. | |
| 8,184,188 | B2* | 5/2012 | Yaghmai | H04N 5/37457 348/308 |
| 8,638,377 | B2* | 1/2014 | Shoyama | H04N 5/367 348/246 |
| 8,816,929 | B2 | 8/2014 | Kam et al. | |
| 9,041,694 | B2 | 5/2015 | Nurmi et al. | |
| 9,635,291 | B2* | 4/2017 | Uchida | H01L 27/14627 |
| 9,848,141 | B2* | 12/2017 | Panicacci | H04N 5/3745 |
| 9,998,721 | B2* | 6/2018 | Rivard | H04N 5/2258 |
| 10,127,964 | B2 | 11/2018 | Sun et al. | |
| 10,147,367 | B2 | 12/2018 | Tan et al. | |
| 10,182,197 | B2* | 1/2019 | Feder | H04N 5/378 |
| 10,375,369 | B2* | 8/2019 | Rivard | H04N 5/23206 |
| 11,069,402 | B1* | 7/2021 | Jaiswal | G11C 16/26 |
| 2010/0051784 | A1* | 3/2010 | Parks | H04N 5/3741 250/208.1 |
| 2012/0038604 | A1 | 2/2012 | Liu et al. | |
| 2012/0212384 | A1 | 8/2012 | Kam et al. | |
| 2013/0075593 | A1* | 3/2013 | Williams, Jr. | H01L 27/14636 250/208.1 |
| 2014/0198072 | A1 | 7/2014 | Schuele et al. | |
| 2018/0005588 | A1* | 1/2018 | Kurokawa | B60K 35/00 |
| 2018/0167575 | A1* | 6/2018 | Watanabe | H04N 5/378 |
| 2018/0366476 | A1 | 12/2018 | Liu | |
| 2019/0363118 | A1* | 11/2019 | Berkovich | H04N 5/3745 |
| 2020/0195875 | A1* | 6/2020 | Berkovich | G06K 9/627 |

OTHER PUBLICATIONS

George et al., "Nonvolatile Memory Design Based on Ferroelectric FETs", 53nd ACM/EDAC/IEEE Design Automation Conference (DAC), IEEE, 2016, pp. 1-6.

Krestinskaya et al., "Real-time Analog Pixel-to-pixel Dynamic Frame Differencing with Memristive Sensing Circuits", IEEE Sensors, 2018, pp. 1-4.

Lee et al., "R-MRAM: A ROM-Embedded STT MRAM Cache", IEEE Electron Device Letters, vol. 34, No. 10, 2013, pp. 1256-1258.

Long et al., "A Ferroelectric FET Based Processing-in-Memory Architecture for DNN Acceleration", IEEE Journal on Exploratory Solid-State Computational Devices and Circuits, 2019, pp. 1-7.

Olumodeji et al., "Memristor-Based Pixel for Event-Detection Vision Sensor", IEEE Sensors, 2015, pp. 1-4.

Smagulova et al., "CMOS-Memristor Hybrid Integrated Pixel Sensors", IEEE International Symposium on Nanoelectronic and Information Systems (iNIS), 2016, pp. 34-37.

Tsai et al., "A Two-Step Readout CMOS Image Sensor Active Pixel Architecture", IEEE Sensors, 2011, pp. 1941-1945.

Vu et al., "Evaluation of 10MeV Proton Irradiation on 5.5 Mpixel Scientific CMOS Image Sensor", SPIE Remote Sensing Europe, vol. 7826, 2010, pp. 1-8.

Zhang et al., "Compact all-CMOS Spatiotemporal Compressive Sensing Video Camera with Pixel-Wise Coded Exposure", Optics Express, vol. 24, No. 8, 2016, pp. 9013-9024.

Merkel, Jordan, "FeFET Process Integration and Characterization," 37th Annual Microelectronic Engineering Conference, 2019, pp. 1-6.

Mcglone, Joseph F., "Ferroelectric HfO2 Thin Films for FeFET Memory Devices," 34th Annual Microelectronic Engineering Conference, 2016, pp. 1-6.

U.S. Appl. No. 16/820,801, Notice of Allowance dated Apr. 16, 2021, pp. 1-8.

* cited by examiner

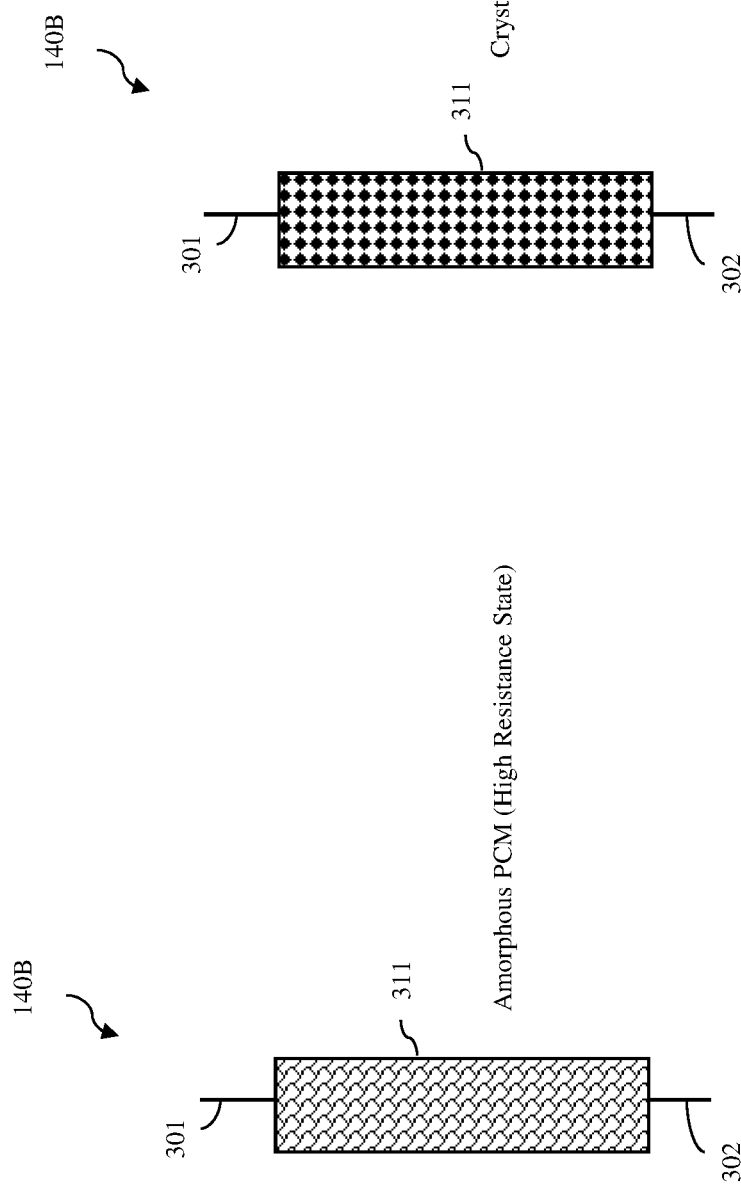

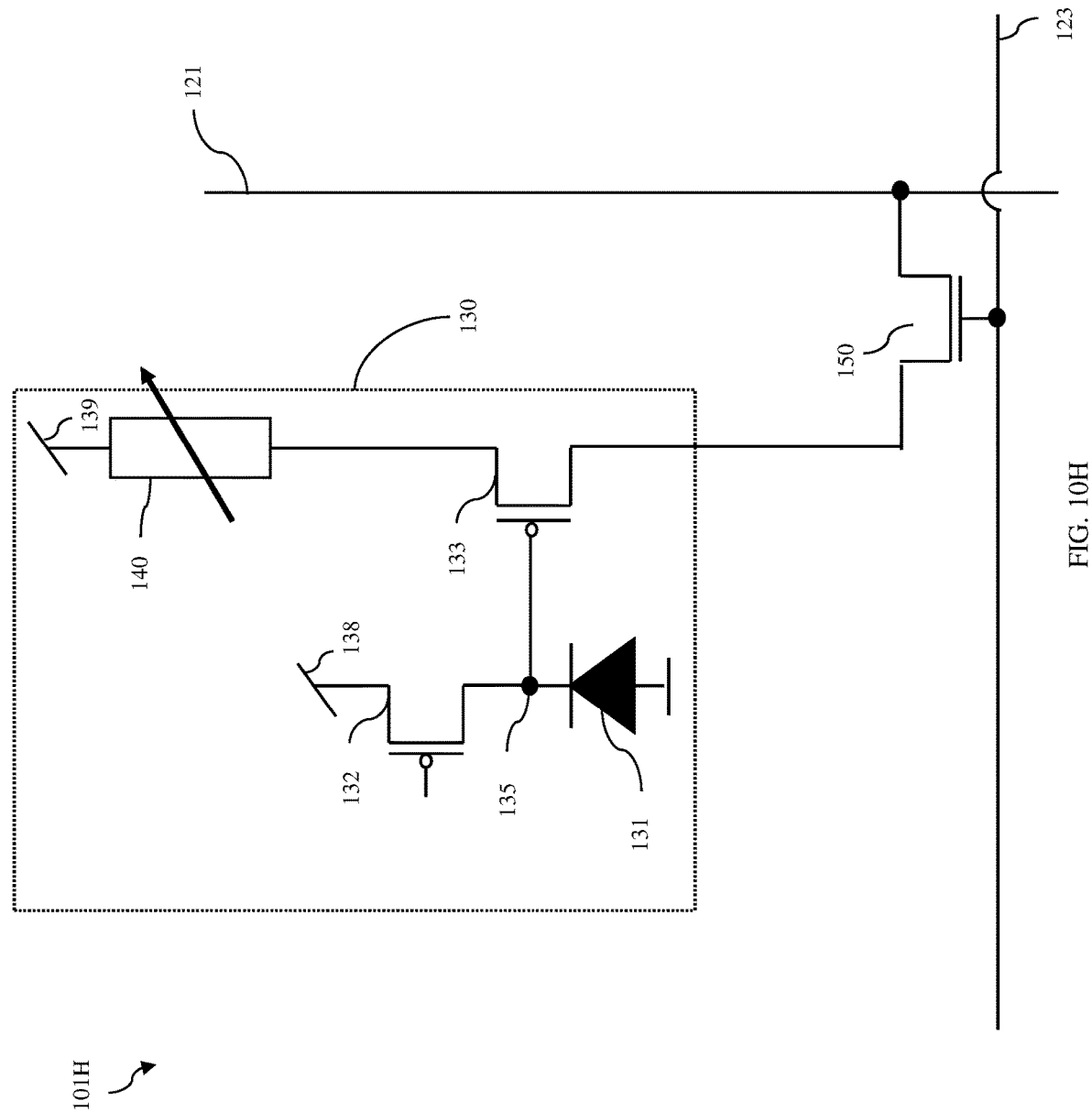

INTEGRATED PIXEL AND TWO-TERMINAL NON-VOLATILE MEMORY CELL AND AN ARRAY OF CELLS FOR DEEP IN-SENSOR, IN-MEMORY COMPUTING

BACKGROUND

Field of the Invention

The present invention relates to complex computing applications (e.g., cognitive computing applications) and, more particularly, to an integrated pixel and two-terminal non-volatile memory (NVM) cell and an array of such cells configured for deep in-sensor, in-memory computing.

Description of Related Art

More specifically, image and voice processing applications typically employ cognitive computing and, particularly, neural networks (NNs) for recognition and classification. Those skilled in the art will recognize that a NN is a deep learning algorithm where approximately 90% of the computations performed in the algorithm are multiply and accumulate (MAC) operations. For example, in a NN for image processing, the various MAC operations are used to compute the products of inputs (also referred to as activations), which are identified intensity values of the pixels in a receptive field, and weights in a filter matrix (also referred to as a kernel) of the same size as the receptive field, and to further compute the sum of the products. These computations are referred to as dot product computations. Historically, software solutions were employed to compute NNs. However, processors with hardware-implemented NN's have been developed to increase processing speed. One disadvantage of processors with hardware-implemented NNs is that they are discrete processing units. For example, a processor with a hardware-implemented NN is typically physically separated from the pixel array that captures the input data (i.e., the processor and the pixel array are in different consumer electronic devices or different chips within the same device). As a result, the data from the pixel array must be uploaded to the processor prior to performing any cognitive computing.

SUMMARY

In view of the foregoing, disclosed herein embodiments of an integrated pixel and a two-terminal non-volatile memory (NVM) cell and embodiments of integrated circuit (IC) structure (i.e., a processing chip) that incorporates an array of such cells for performing deep in-sensor, in-memory computing (e.g., of neural networks). Also disclosed herein are method embodiments for operating an integrated pixel and two-terminal NVM cell and for operating an array of such cells (e.g., to perform deep in-sensor, in-memory computing).

Specifically, disclosed herein are embodiments of an integrate pixel and two-terminal NVM cell. The cell can include at least a select transistor, a two-terminal non-volatile memory (NVM) device (e.g., a magnetic tunnel junction (MTJ) device, a phase change memory (PCM) device, a memristor, etc.) and a pixel. The pixel can include a reset transistor, a photodiode connected in series with the reset transistor, and a sense node at a junction between the reset transistor and the photodiode. The pixel can also include an amplifying transistor, which is connected in series with the two-terminal NVM device and the select transistor and which has a gate electrically connected to the sense node. Such a cell can be selectively operable in a write mode, a read mode and a functional computing mode, as discussed further in the detailed description section.

Also disclosed herein are embodiments of integrated circuit (IC) structure (i.e., a processing chip) that incorporates an array of integrated pixel and two-terminal NVM cells. The cells can be arranged in columns and rows and the IC structure can further include bitlines connected to the columns of cells, respectively, and wordlines connected to the rows of cells, respectively. Each cell in a given column and row can at least include a select transistor, a two-terminal NVM device (e.g., an MTJ device, a PCM device, a memristor, etc.) and a pixel. The pixel can include a reset transistor, a photodiode, a sense node, and an amplifying transistor. The reset transistor can be connected in series between a first voltage rail (e.g., a positive voltage rail set at VDD) and the photodiode. The sense node can be at a junction between the reset transistor and the photodiode and can also be electrically connected to the gate of the amplifying transistor. Additionally, the amplifying transistor, the two-terminal NVM device, and the select transistor can all be connected in series between an adjustable second voltage rail and a bitline for the column. For purposes of this disclosure, an adjustable voltage rail refers to a voltage rail upon which different voltages can be selectively applied. The gate of the select transistor can be electrically connected to a wordline for the row. The cells in the array are all selectively operable in a write mode, a read mode and a functional computing mode.

For example, during the write mode in a specific cell in a specific row and a specific column, the reset transistor and the select transistor of the specific cell can be turned on. Furthermore, specific bias conditions can be applied to the adjustable second voltage rail and thereby to one terminal of the two-terminal NVM device and to a specific bitline for the specific column and thereby to the other terminal of the two-terminal NVM device in order to store a first data value in the two-terminal NVM device of the specific cell. It should be noted that the specific bias conditions will vary depending upon the desired stored data value and on the type and configuration of the two-terminal NVM device (as discussed further in the detailed description section).

In any case, during the read mode of the specific cell, the specific bitline for the specific column containing the specific cell can be connected to ground and the adjustable second voltage rail can be set at a read voltage (Vread) level. The reset transistor and the select transistor of the specific cell can be turned on and a given electrical parameter on the specific bitline (e.g., a read current (Iread)) can be sensed in order to read out the first data value.

During the functional computing mode in the specific cell, the specific bitline for the specific column containing the specific cell can again be connected to ground and the adjustable second voltage rail can be set at the read voltage (Vread) level. Additionally, when the select transistor is still turned off, the reset transistor can be turned on in order to pre-charge the sense node. Then reset transistor can be turned off. Next, the photodiode of the specific cell can be exposed to light, resulting in a second data value being on the sense node. The select transistor of the cell can be turned on and a given electrical parameter on the specific bitline (e.g., a bitline voltage or a bitline current) can be sensed. Any change in this given electrical parameter on the specific bitline in response to the above-described functional computing processes will be indicative of a product of the first data value and the second data value in the specific cell.

Furthermore, a total change in this given electrical parameter on the specific bitline in response to multiple cells in the same specific column concurrently operating in the functional computing mode will be indicative of a result of a dot product computation. Thus, the above-described IC can be employed for deep in-sensor, in-memory computing of applications that require the performance of dot product computations (e.g., for deep in-sensor, in-memory computing of neural networks).

Also disclosed herein are associated method embodiments. Specifically, a disclosed method can include providing an integrated circuit (IC) structure (i.e., a processing chip), as described in detail above, that incorporates an array of integrated pixel and two-terminal NVM cells. The method can further include selectively operating the cells in that array in a write mode, a read mode and a functional computing mode.

Specifically, operating a specific cell in a specific row and a specific column in a write mode can include applying specific bias conditions to the adjustable second voltage rail and a specific bitline for the specific column. The reset transistor and the select transistor of the specific cell can be turned on so that specific bias conditions are applied to the two terminals of the two-terminal NVM device in order to store a first data value in the two-terminal NVM device. It should be noted that the specific bias conditions will vary depending upon the desired stored data value and on the type and configuration of the two-terminal NVM device (as discussed further in the detailed description section).

Operating a specific cell in a specific row and a specific column in the read mode can include connecting a specific bitline for the specific column containing the specific cell to ground and setting the voltage level on the adjustable second voltage rail to a read voltage (Vread) level. The reset transistor and the select transistor of the specific cell can be turned on and a given electrical parameter on the specific bitline (e.g., a read current (Iread)) for the specific column can be sensed in order to determine the first data value.

Operating a specific cell in a specific row and a specific column in the functional computing mode can include connecting the specific bitline for the specific column containing the cell to ground and setting the voltage level on the adjustable second voltage rail to a read voltage (Vread) level. Operating the specific cell in the functional computing mode can further include pre-charging the sense node of the specific cell (e.g., by turning on the reset transistor, while keeping the select transistor turned off). Subsequently, a light sensing process can be performed by exposing the photodiode of the specific cell to light resulting in a second data value being output on the sense node. Additionally, the select transistor for the specific cell can be turned on and any change in a given electrical parameter on the specific bitline (e.g., a bitline voltage or a bitline current) can be sensed. Any change in the given electrical parameter on the specific bitline in response to the above-described functional computing process steps will be indicative of a product of the first data value and the second data value in the specific cell. Furthermore, a total change in the given electrical parameter on the specific bitline in response to multiple cells in the same specific column concurrently operating in the functional computing mode will be indicative of a result of a dot product computation. Thus, the method can be employed for deep in-sensor, in-memory computing of applications that require dot product computations (e.g., for deep in-sensor, in-memory computing of neural networks).

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 3A and 3B are diagrams illustrating different resistance states of a phase change memory (PCM)-type NVM device;

FIGS. 10A-10H are schematic diagrams illustrating alternative embodiments, respectively, of an integrated pixel and two-terminal non-volatile memory (NVM) cell that could be incorporated into the array of FIG. 1.

DETAILED DESCRIPTION

Figure 1:
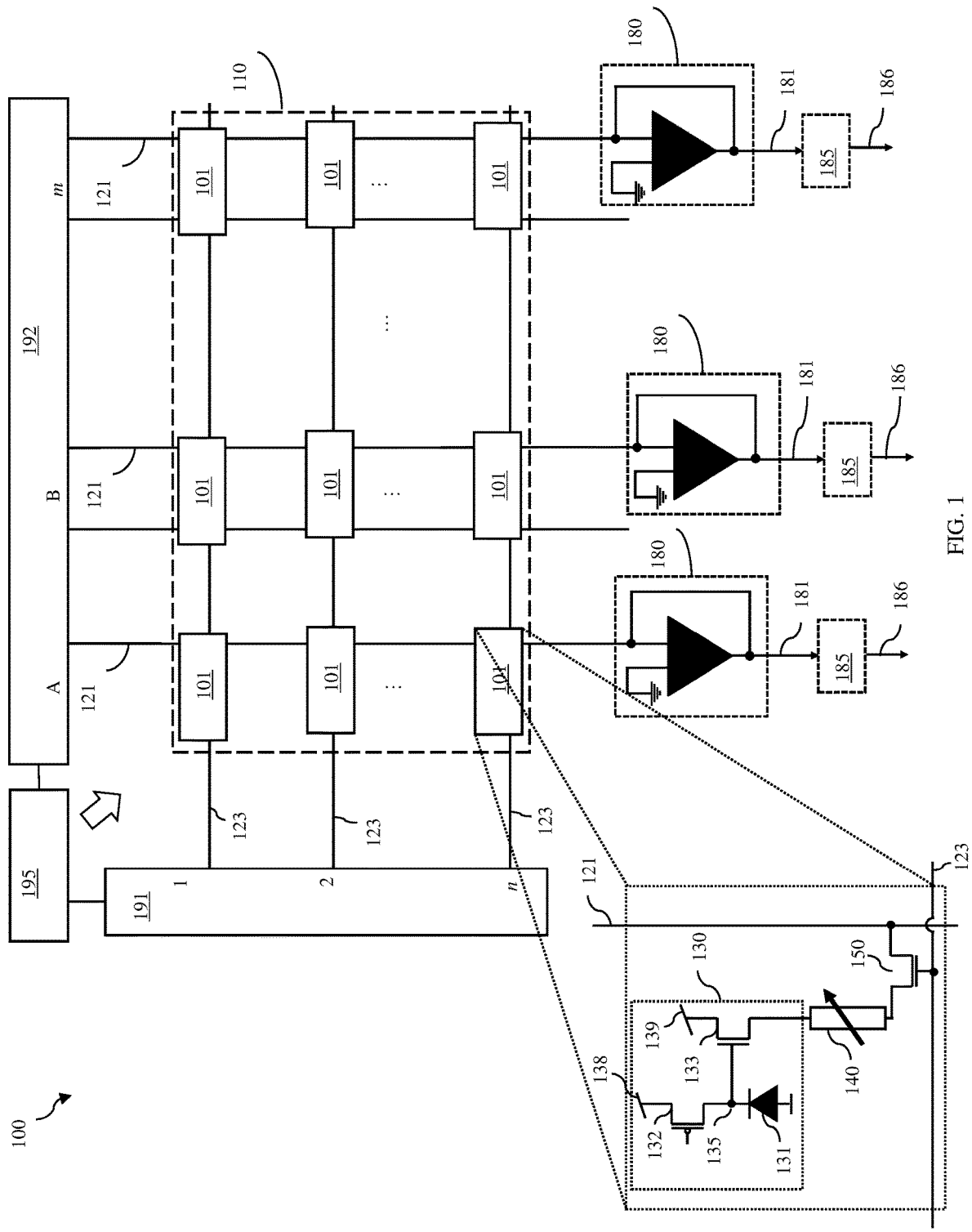
FIG. 1 is a schematic diagram illustrating an embodiment of an integrated pixel and two-terminal non-volatile memory (NVM) cell and also an embodiment of an integrated circuit (IC) structure that includes an array of such cells.

As mentioned above, image and voice processing applications typically employ cognitive computing and, particularly, neural networks (NNs) for recognition and classification. Those skilled in the art will recognize that a NN is a deep learning algorithm where approximately 90% of the computations performed in the algorithm are multiply and accumulate (MAC) operations. For example, in a NN for image processing, the various MAC operations are used to compute the products of inputs (also referred to as activations), which are identified intensity values of the pixels in a receptive field, and weights in a convolution filter matrix (also referred to as a kernel) of the same size as the receptive field, and to further compute the sum of the products. Historically, software solutions were employed to compute NNs. However, processors with hardware-implemented NN's have been developed to increase processing speed. One disadvantage of processors with hardware-implemented NNs is that they are discrete processing units. For example, a processor with a hardware-implemented NN is typically physically separated from the pixel array that captures the input data (i.e., the processor and the pixel array are in different consumer electronic devices or different chips within the same device). As a result, the data from the pixel array must be uploaded to the processor prior to performing any cognitive computing.

In view of the foregoing, disclosed herein are embodiments of an integrated pixel and two-terminal NVM cell and of an integrated circuit (IC) structure that incorporates an array of such cells. The disclosed cell can specifically incorporate a two-terminal NVM device (e.g., a magnetic tunnel junction (MTJ) device, a phase change memory (PCM) device, or a memristor) and a pixel. Given the configuration of the cell (as described in greater detail below), it can be selectively operated in write, read and functional computing modes. In the write mode, a first data value (e.g., a binary weight value) can be stored in the two-terminal NVM device. In the read mode, the first data value can be read from the two-terminal NVM device. In the functional computing mode, the pixel can capture a second data value (e.g., an analog input value) and a given electrical parameter on a bitline (e.g., a bitline voltage or bitline current), which is connected to the cell, can be sensed. Any change in the given electrical parameter on the bitline will be function of both the first data value and the second data value. The disclosed IC structure can include an array of such cells arranged in columns and rows. If multiple cells in a given column are concurrently operated in the functional computing mode, the total change in the given electrical parameter on the bitline for the column will be indicative of a result of a dot product computation. Thus, the IC structure can be employed for deep in-sensor, in-memory computing of applications that require dot product computations (e.g., for deep in-sensor, in-memory computing of neural networks).

FIG. 1 is a schematic diagram illustrating embodiments of an integrated pixel and two-terminal non-volatile memory (NVM) cell 101 and embodiments an integrated circuit (IC) structure 100 (e.g., a processing chip), which incorporates an array 110 of the cells 101.

Specifically, the IC structure 100 can include an array 110 of integrated pixel and two-terminal NVM cells 101. The cells 101 within the array 110 can be arranged in columns (e.g., see columns A, B, . . . m) and rows (e.g., see rows 1, 2, . . . n).

Wordlines 123 can be electrically connected to the cells 101 in each row. Bitlines 121 can be electrically connected to the cells 101 in each column.

Each cell 101 in a specific row and a specific column can include: a select transistor 150; a two-terminal NVM device 140; and a pixel 130.

In each cell 101, the select transistor 150 can be an N-type field effect transistor (NFET). This select transistor 150 can have a gate electrically connected to a specific wordline 123 for the specific row containing the specific cell. This select transistor 150 can further have a source region electrically connected to a specific bitline 121 for the specific column containing the specific cell.

Figures 2A, 2B:
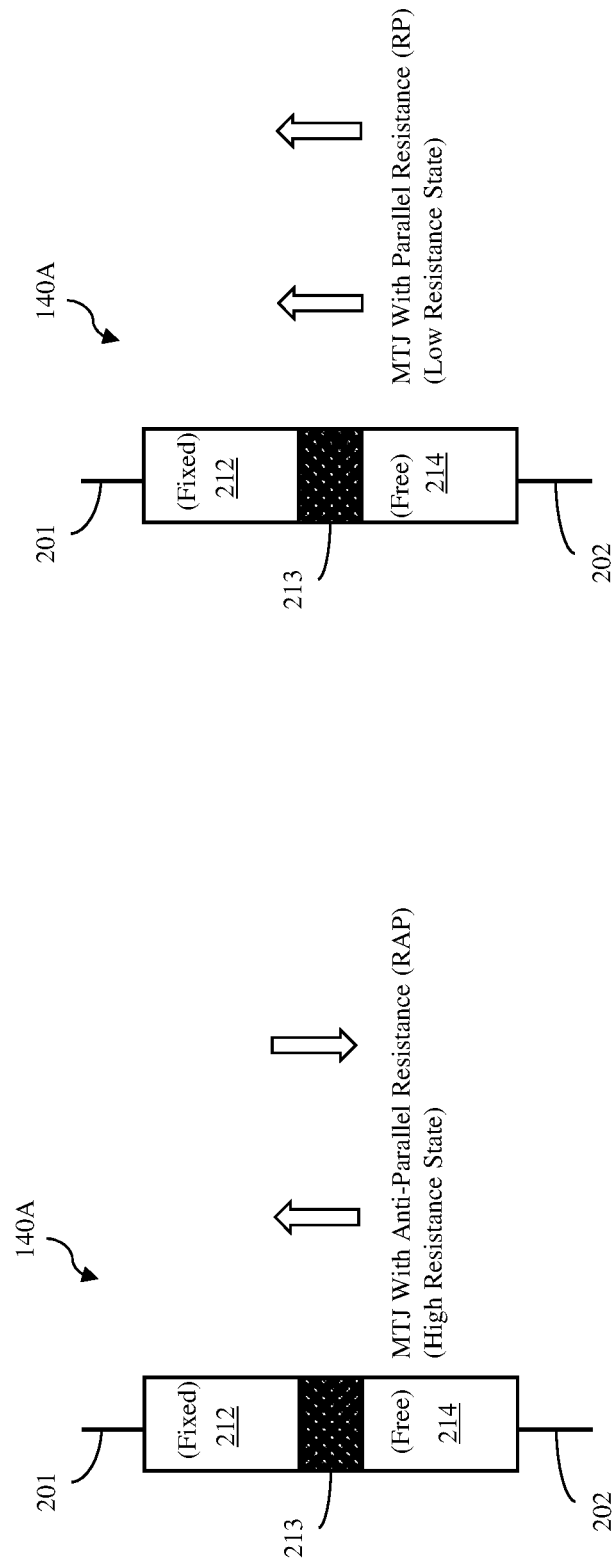
FIGS. 2A and 2B are diagrams illustrating different resistance states of a magnetic tunnel junction (MTJ)-type NVM device.
Figures 4A, 4B:
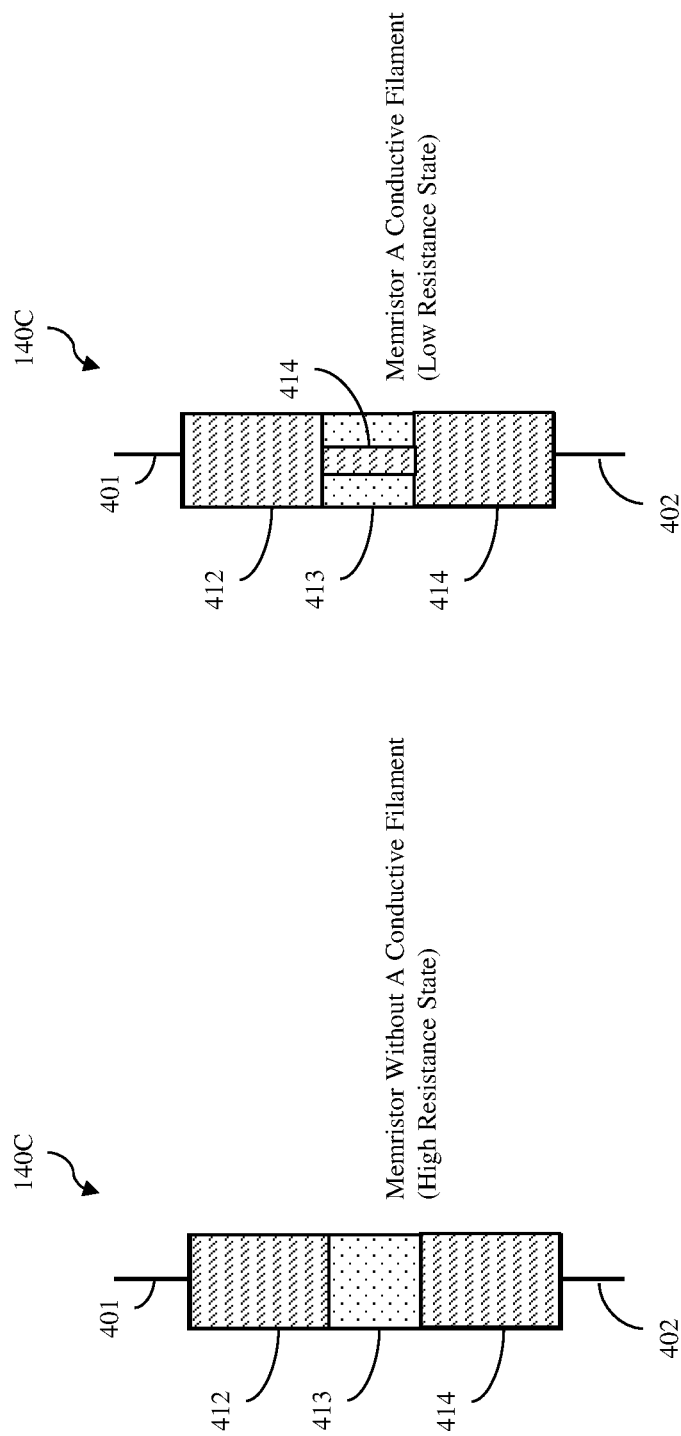
FIGS. 4A and 4B are diagrams illustrating different resistance states of a memristor-type NVM device.

In each cell 101, the two-terminal NVM device 140 can be any programmable resistor, which has a first terminal and a second terminal, and which is configured so that, by applying specific bias conditions to one or both of the two terminals, the resistance of the resistor can be changed. For example, the resistance state of such a programmable resistor can be changed to a high resistance state to store one logic value (e.g., a logic "1") or to a low resistance state to store a different logic value (e.g., a logic "0"). Alternatively, the resistance state of such a programmable resistor could be changed to any one of more than two different resistances states to store multi-bit binary numbers (e.g., 00, 01, 10, and 11). Exemplary two-terminal NVM devices include, but are not limited to, magnetic tunnel junction (MTJ) device 140A (also referred to herein as an MTJ-type variable resistor and shown in FIGS. 2A-2B), a phase change memory (PCM) device 140B (also referred to herein as a PCM-type variable resistor and shown in FIGS. 3A-3B), and a memristor 140C (shown in FIGS. 4A-4C).

Those skilled in the art will recognize that an MTJ device 140A is typically a back end of the line (BEOL) multi-layer structure, which includes a fixed ferromagnetic layer 212 (also referred to as a pinned layer) at a first terminal 201 and a switchable ferromagnetic layer 214 (also referred to as a free layer) at a second terminal 202 and separated from the fixed ferromagnetic layer 212 by a thin dielectric layer 213 (e.g., a thin oxide layer). Depending upon the biasing conditions on the first terminal 201 and the second terminal 202 during a write operation, the MTJ device 140A exhibits different resistances (e.g., a low resistance or a high resistance). For example, during a write operation, a high positive voltage (VDD) can be applied to the first terminal 201 and the second terminal 202 can be discharged to ground (e.g., at 0V). In this case, current flow causes the free layer to switch to (or maintain) the anti-parallel resistance (RAP) state (also referred to as a high resistance state), thereby storing one logic value (e.g., a logic "1"). Alternatively, during the write operation, VDD can be applied to the second terminal 202 and the first terminal 201 can be discharged to ground (e.g., at 0V). In this case, current flow causes the free layer to switch to (or maintain) a parallel resistance (RP) state (also referred as a low resistance state), thereby storing another logic value (e.g., a logic "0").

Those skilled in the art will recognize that a PCM device 140B employs a phase change material 311 (e.g., a chalcogenide compound) with programmable structural phases that exhibit different resistances. Switching of the phase is dependent upon the local temperature, which is controlled by the length and strength of an applied voltage. For example, switching from a crystalline to an amorphous phase to store one logic value (e.g., a logic "1") can be achieved by applying a short high voltage pulse to one or both of the terminals 301-302 in order to quickly heat the phase change material above its melting point (see FIG. 3A). Switching from an amorphous phase to the crystalline phase to store another logic value (e.g., a logic "0") can be achieved by applying a longer lower voltage pulse to one or both of the terminals 301-302 in order to heat the phase change material to its crystallization temperature and then allowing it to cool (see FIG. 3B). Optionally, pulses of different lengths and/or voltages could be applied to achieve one of more than two different structural phases (e.g., an amorphous phase, a not fully amorphous phase, a not fully crystalline phase or a crystalline phase) associated with different resistance levels and, thereby to allow one of more than two different data values to be stored (e.g., 00, 01, 10, 11).

Those skilled in the art will recognize that a memristor 140C is also typically a back end of the line (BEOL) multi-layer structure, which includes two metal layer 412 and 414 separated by a dielectric layer 413 (e.g., hafnium oxide (HfO$_x$) or some other suitable oxide layer, also referred to as a switching layer). Depending upon the biasing conditions on the first terminal 401 and the second terminal 402 during a write operation, ions in the dielectric layer 413 may migrate to: (a) either break-up a conductive filament between the metal layers 412 and 414 so that the memristor 140C is in a high resistance state, thereby storing one logic value (e.g., a logic "1") or (b) grow a conductive filament 414 in the dielectric layer 413 and extending between the metal layers 412 and 414 so that the memristor 140C is in a low resistance state, thereby storing a different logic value (e.g., a logic "0").

In each cell 101, the pixel 130 can include a photodiode 131, a reset transistor 132, a sense node 135, and an amplifying transistor 133. The photodiode 131 can be, for example, a PIN photodiode. The reset transistor 132 can be a p-type field effect transistor (PFET)) and the amplifying transistor 133 can be an n-type field effect transistor (NFET) (also referred to in the art as a source-follower transistor). The reset transistor 132 can be electrically connected in series between a first voltage rail 138 (e.g., a positive voltage rail) and the photodiode 131. The sense node 135 can be at the junction between the photodiode 131 and the reset transistor 132. The reset transistor 132 can have a gate controlled by a reset (RST) signal (e.g., from a controller 195). The amplifying transistor 133 can be another NFET and the gate of the amplifying transistor 133 can be electrically connected to the sense node 135.

Additionally, the pixel 130 can be integrated with the two-terminal NVM device 140. Specifically, the amplifying transistor 133, the two-terminal NVM device 140, and the NVM select transistor 150 can all be connected in series between an adjustable second voltage rail 139 and the bitline 121 for the specific column containing the cell 101. For purposes of this disclosure, an adjustable voltage rail refers to a voltage rail upon which different voltages can be selectively applied. Furthermore, the gate of the select transistor 150 can be electrically connected the wordline 123 for the specific row containing the cell 101.

The IC structure 100 can further be configured so that all of the cells 101 in the array 110 are selectively operable in a write mode, in a read mode and a functional computing mode. Specifically, the IC structure 100 can further include a sense circuit configured to sense changes in the voltage levels on (or current flowing through) the bitlines 121 of the columns in the IC structure 100. For example, the sense circuit can include transimpedance amplifiers (TIAs) 180 for each of the columns, respectively. The TIAs 180 can detect and output (i.e., can be adapted to detect and output, can be configured to detect and output, etc.) the analog levels of an electrical parameter on the bitlines 121 (e.g., a bitline voltage or bitline current) for each column, respectively. Specifically, each TIA 180 can have a first input, which is electrically connected to ground, and a second input, which is electrically connected to a bitline 121 for a column in order to receive a current (Iin) from that bitline 121. Each TIA 180 can further convert (i.e., can be adapted to convert, can be configured an output, etc.) the received current (Iin) into an analog output voltage (Vout). The analog output voltage 181 of the TIA 180 (i.e., Vout) can further be electrically connected via a feedback resistor to the bitline 121 for the column (i.e., to the second input). In any case, various different TIA configurations are well known in the art. Thus, the details of the TIAs have been omitted from this specification in order to allow the reader to focus on the salient aspects of the disclosed embodiments.

Optionally, the IC structure 100 can further include analog-to-digital converters (ADCs) 185 for each of the columns, respectively. The ADCs 185 can receive the analog output voltages 181 from the TIA's 180, respectively, and can convert (i.e., can be adapted to convert, can be configured to convert, etc.) those analog output voltages 181 into digital outputs 186, respectively. ADCs capable of converting analog output voltages to digital values are well known in the art. Thus, the details of the ADCs have been omitted from this specification in order to allow the reader to focus on the salient aspects of the disclosed embodiments.

The IC structure 100 can further include a controller 195 and peripheral circuitry 191-192. In response to control signals from the controller 195, the peripheral circuitry 191-192 can enable the cells 101 to be individually selectively operated in a write mode, a read mode or a functional computing mode, as discussed below. Peripheral circuitry 191 connected to the rows (at one end or at a combination of both ends) can include, for example, address decode logic and wordline drivers for activating selected wordlines (i.e., for switching selected wordlines from low to high voltage levels) during the write, read and functional computing operations. Peripheral circuitry 192 connected to the columns (at one end or at a combination of both ends) can include column address decode logic and bitline drivers for appropriately biasing selected bitlines during the write, read and functional computing operations. Additional peripheral circuitry (not shown) can also supply the reset signals to gates of the reset transistors of the pixels in the cells and selectively change the voltage level on the adjustable second voltage rail 139 (as discussed below). Controllers and peripheral circuitry used to enable pixel array and NVM array operations are well known in the art. Thus, the details thereof have been omitted from this specification in order to allow the reader to focus on the salient aspects of the disclosed embodiments.

As mentioned above, each cell 101 in the array 110 of the IC structure 100 of FIG. 1 is selectively operable in the following modes: (a) a write mode, wherein a first data value is written to the two-terminal NVM device 140; (b) a read mode, wherein the first data value is read from the two-terminal NVM device 140; and (c) a functional computing mode.

For a write operation in a specific cell in a specific column and a specific row, a first data value can be written to the two-terminal NVM device 140. This first data value can be a single-bit binary data value (e.g., "1" or "0"). To perform the write operation, the RST signal applied to the gate of the reset transistor 132 (which is a PFET) can be switched to a low voltage level (e.g., 0 volts), thereby turning on the reset transistor 132. As a result, the reset transistor 132 pulls up the voltage on the sense node 135 to a high voltage level (e.g., to VDD), thereby turning on the amplifying transistor 133 (which is an NFET). Additionally, the specific wordline 123 for the specific row containing the specific cell 101 can be switched to the high voltage level (e.g., to VDD), thereby turning on the select transistor 150 for the specific cell 101. As a result, current flow between the adjustable second voltage rail 139 and the specific bitline 121 for the specific column containing the specific cell 101 is enabled and different bias conditions can be selectively applied to the first terminal of the two-terminal NVM device 140 via the adjustable second voltage rail 139 and/or to the second terminal of the two-terminal NVM device 140 via the specific bitline 121 in order to write the desired first data value (e.g., a logic "1" or a logic "0") into the two-terminal NVM 140. As discussed above with regard to the different types of two-terminal NVM devices, the specific bias conditions may vary depending upon the desired stored data value and on the type and configuration of the two-terminal NVM device.

Figure 5A:
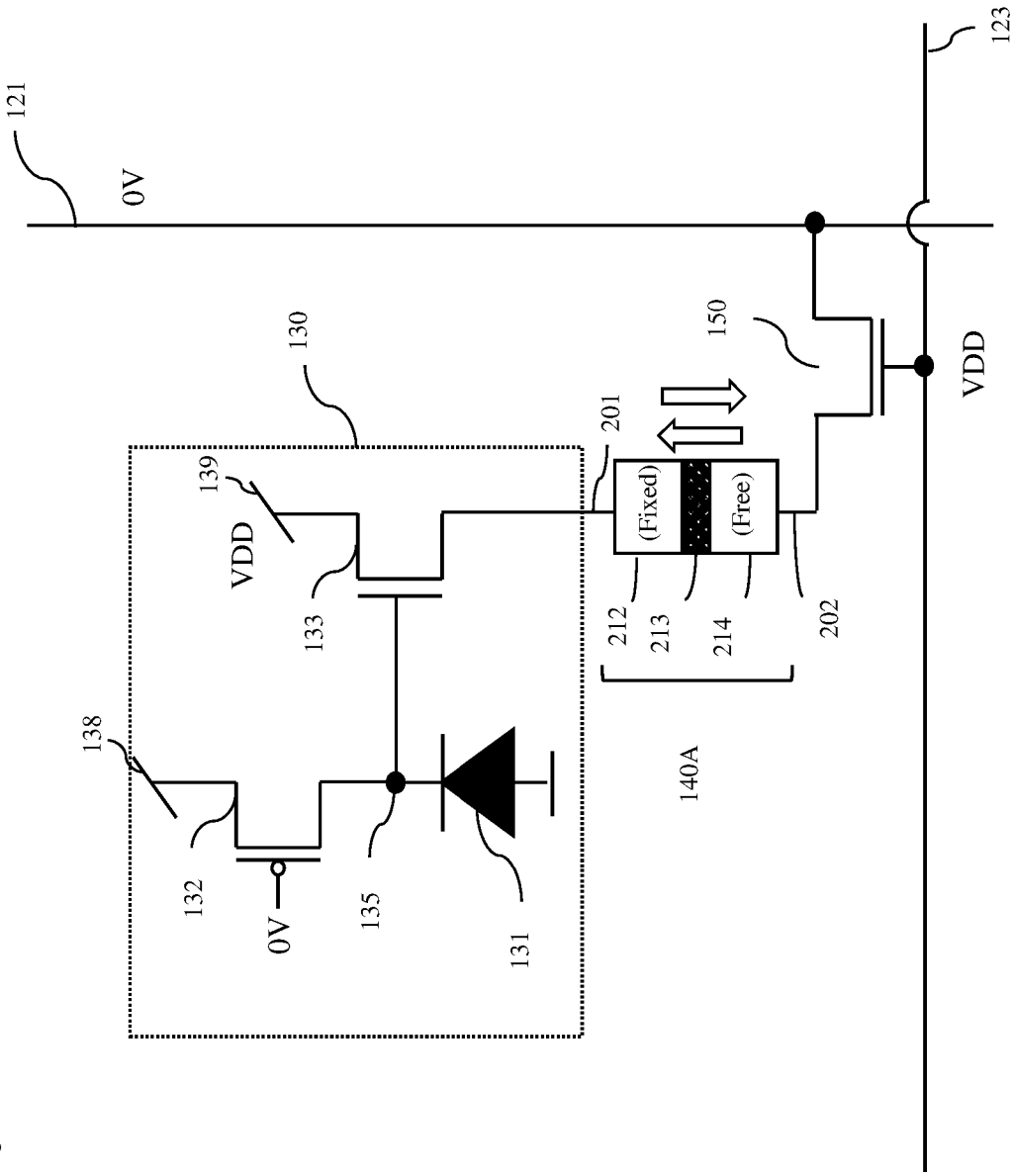
FIGS. 5A and 5B are schematic diagrams illustrating exemplary write "1" and write "0" operations, respectively, in an integrated pixel and two-terminal non-volatile memory (NVM) cell that includes an MTJ-type NVM device.
Figure 5B:
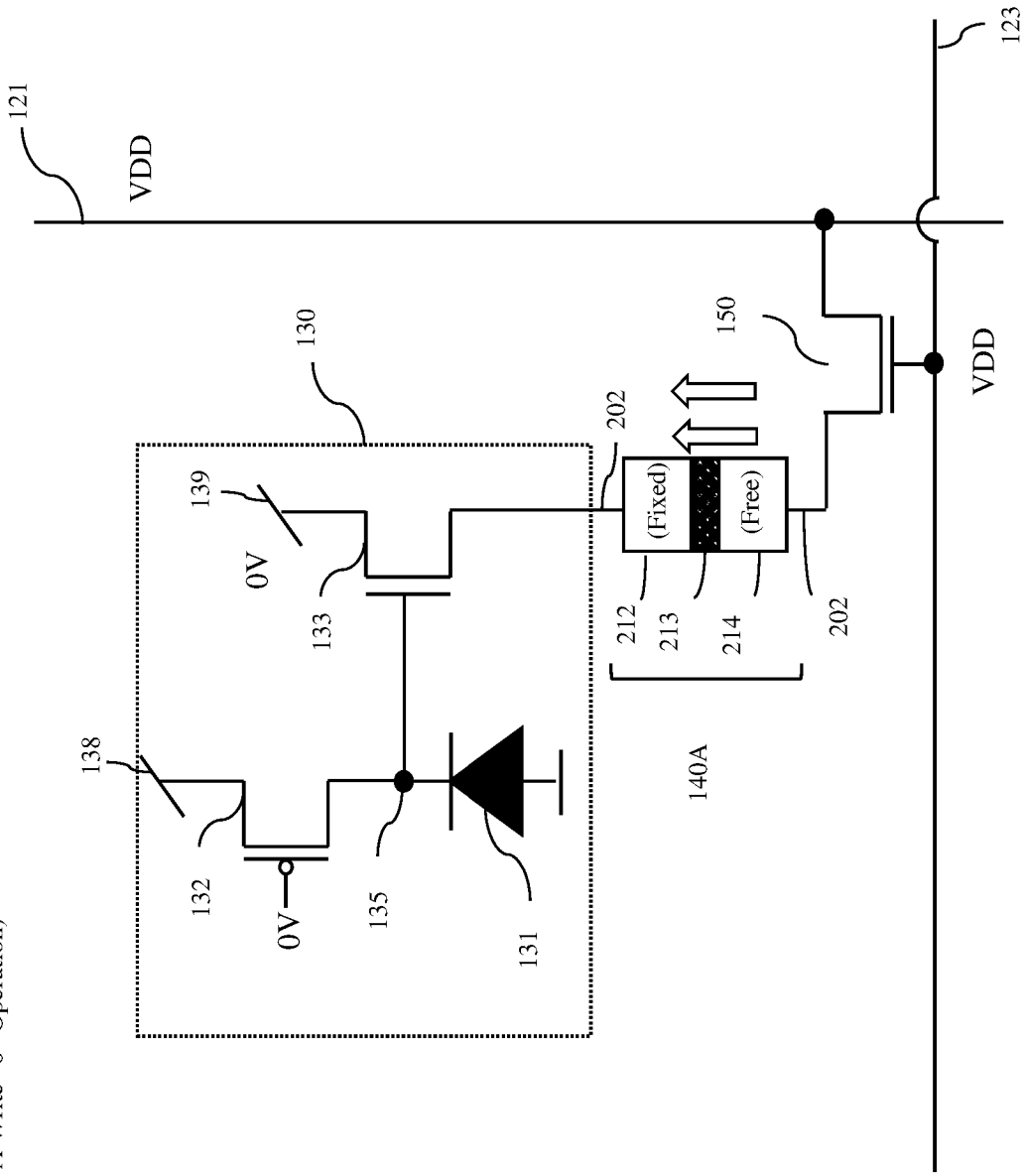

For example, consider an exemplary integrated pixel and two-terminal NVM cell 101 having an MJT device 140A, as shown FIGS. 5A and 5B. For a write operation to write a first data value into this MTJ device 140A, the reset transistor 132 is turned on by switching the RST signal (which is applied to the gate of the reset transistor 132) to the low voltage level (e.g., 0 volts) and the select transistor 150 is turned on by switching the wordline 123 (which is connected to the gate of the select transistor 150) to the high voltage level (e.g., to VDD). Writing one logic value (e.g., a logic "1") could be performed by setting the voltage level on the adjustable second voltage rail 139 to the high voltage level (e.g., VDD) in order to apply a high positive voltage on the first terminal 201 of the MJT device 140A through the amplifying transistor 133 and by discharging the bitline 121 to ground in order to apply 0 volts to the second terminal 202 of the MJT device 140A through the select transistor 150. As mentioned above, in this case, current flow causes the free layer to switch to (or maintain) the anti-parallel resistance (RAP) state (also referred to as a high resistance state), thereby storing one logic value (e.g., a logic "1"). Writing another logic value (e.g., a logic "0") could be performed by discharging the voltage level on the adjustable second voltage rail 139 to ground in order to apply 0 volts to the first terminal 201 of the MJT device 140A through the amplifying transistor 133 and by setting the voltage level on the bitline 121 to the high voltage level (e.g., VDD) in order to apply a high positive voltage to the second terminal 202 of the MJT device 140A through the select transistor 150. As mentioned above, in this case, current flow causes the free layer to switch to (or maintain) a parallel resistance (RP) state (also referred as a low resistance state), thereby storing another logic value (e.g., a logic "0").

Figure 6:
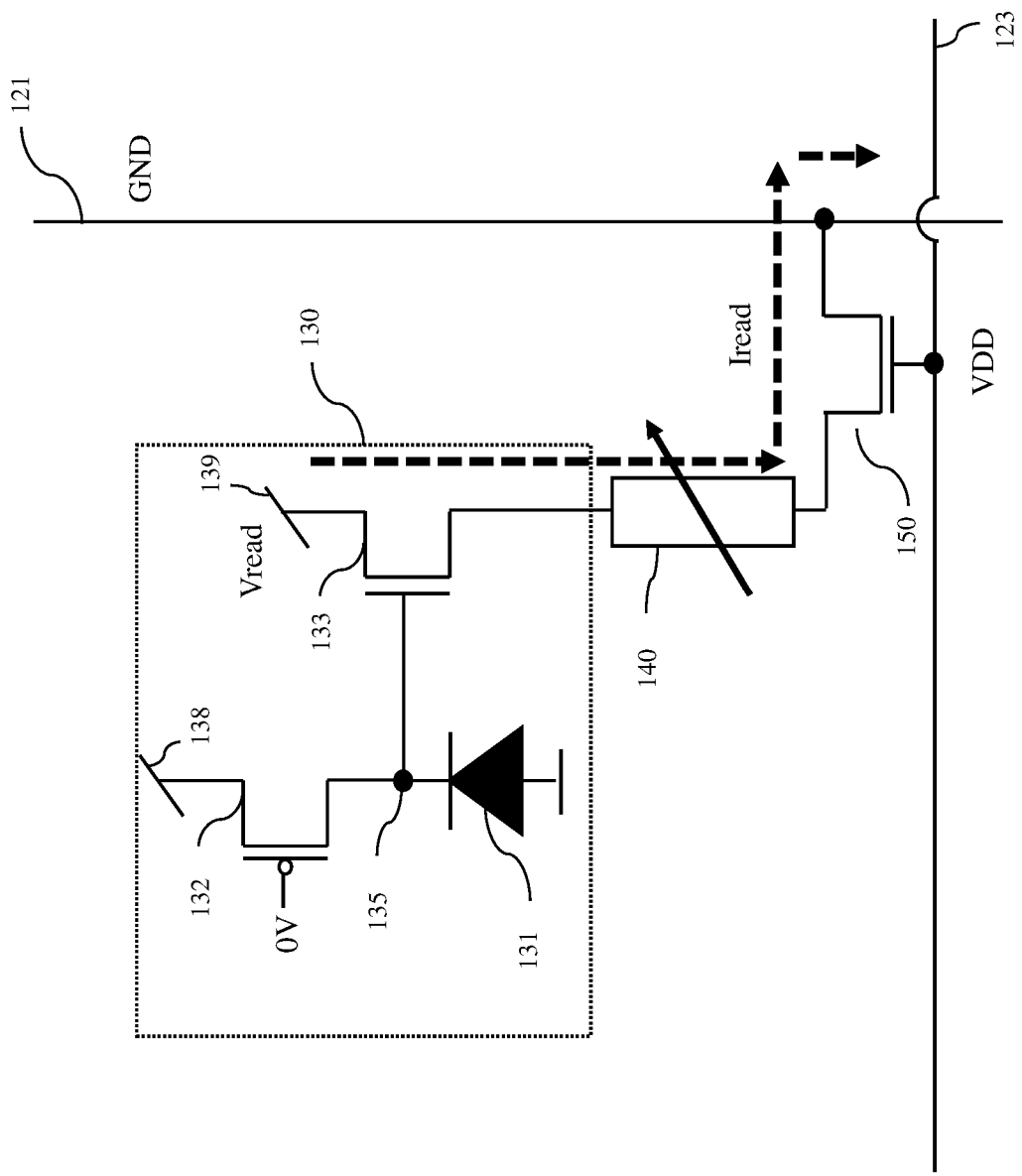
FIG. 6 is a schematic diagram illustrating an exemplary read operation an integrated pixel and two-terminal non-volatile memory (NVM) cell.

For a read operation in a specific cell in a specific column and a specific row (see FIG. 6), a previously stored first data value can be read from the two-terminal NVM device 140. To perform the read operation, the specific bitline 121 for the specific column can be connected to ground (e.g., through a low resistance path) and the voltage level on the adjustable second voltage rail 139 can be set at a read voltage (Vread) level. Vread can be lower than VDD (e.g., by 30-70%) and the optimal level for Vread can be predetermined depending upon the type of NVM in the cell. Additionally, the RST signal applied to the gate of the reset transistor 132 (which is a PFET) can again be switched to the low voltage level (e.g., 0 volts), thereby turning on the reset transistor 132. As a result, the reset transistor 132 pulls up the voltage level on the sense node 135, thereby turning on the amplifying transistor 133 (which is an NFET). Additionally, the specific wordline 123 connected to the gate of the select transistor 150 (which is an NFET) can be switched to the high voltage level (e.g., to VDD), thereby turning on the select transistor 150. As a result, flow of a read current (Tread) between the adjustable second voltage rail 139 and the specific bitline 121 is enabled. If only the specific wordline 123 for the row containing the cell is activated (i.e., if no other wordlines are activated), then the read current (Iread) on the specific bitline 121 for the column and applied as the input (Tin) to the TIA 180 will indicate whether the first data value is a logic "1" or a logic "0". Iin will be low when resistance in the two-terminal NVM device 140 is high (e.g., to read a logic "1") and vice versa (e.g., to read a logic "0").

Figure 7:
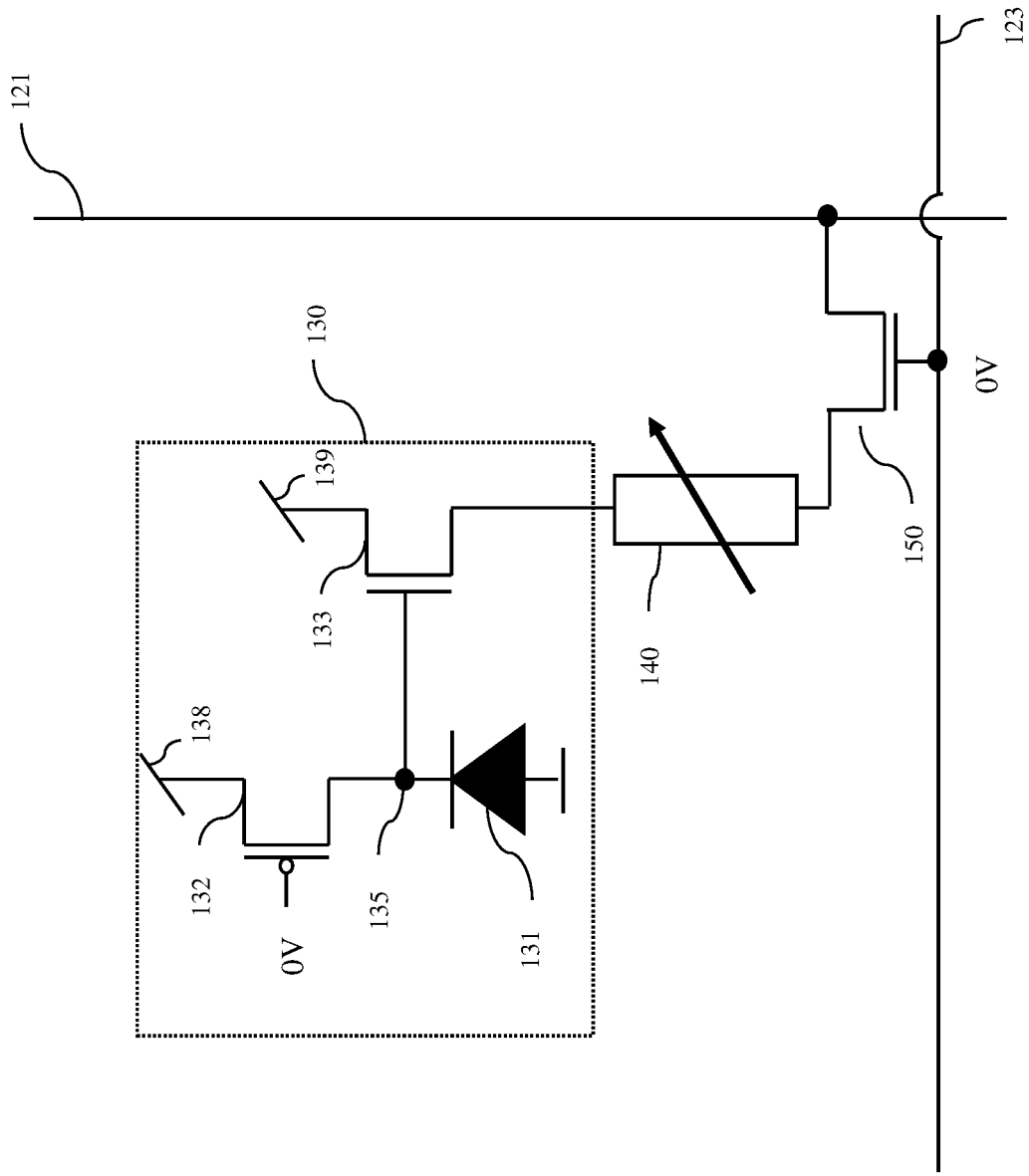
FIG. 7 is a schematic diagram illustrating an exemplary sense node pre-charge operation for a functional computing operation in an integrated pixel and two-terminal non-volatile memory (NVM) cell.
Figure 8:
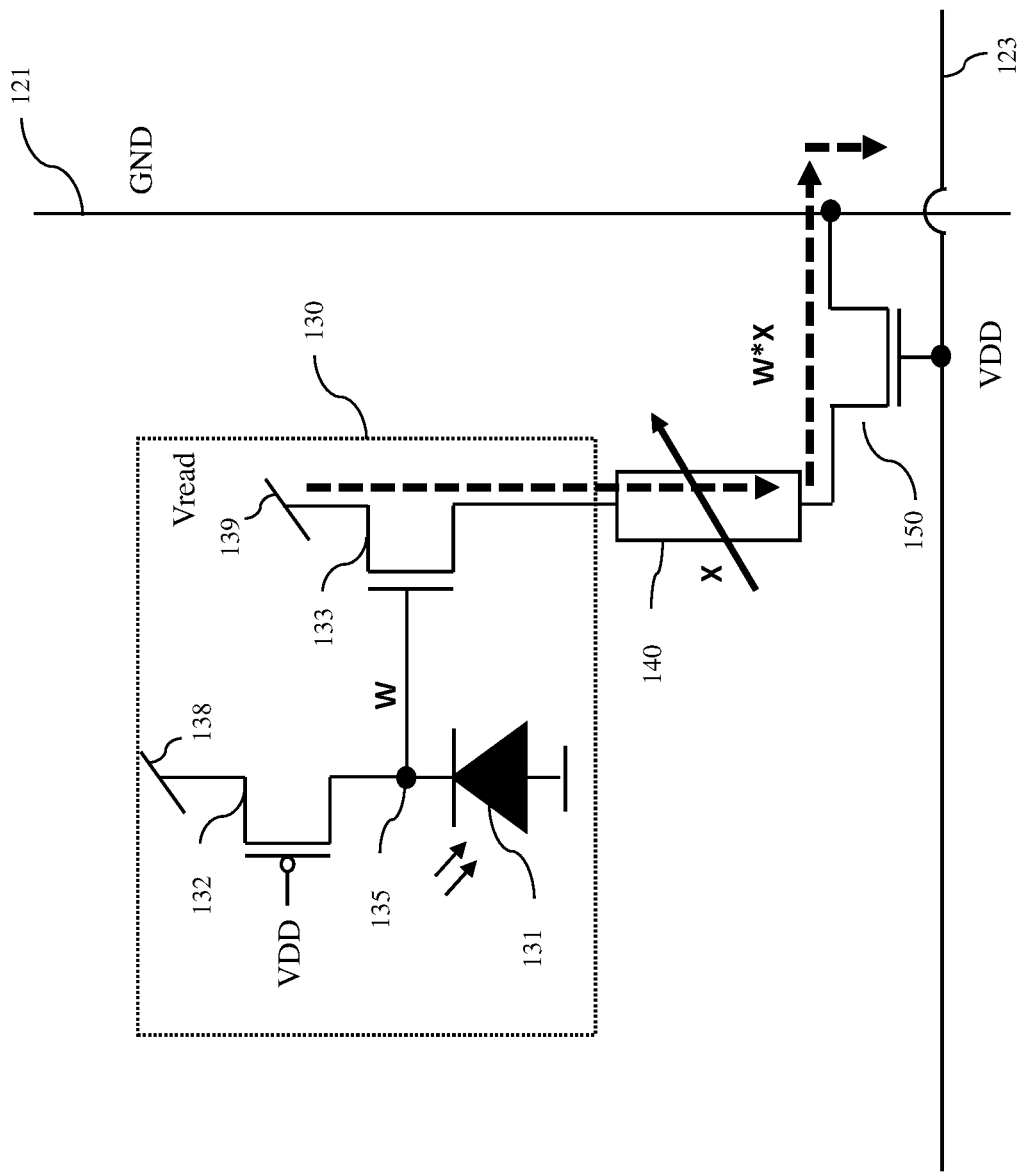
FIG. 8 is a schematic diagram illustrating an exemplary functional computing operation in an integrated pixel and two-terminal non-volatile memory (NVM) cell.

For a functional computing operation, the specific bitline 121 for the specific column containing the specific cell can again be connected to ground (e.g., through a low resistance path) and the voltage level on the adjustable second voltage rail 139 can again be set at the read voltage (Vread) level. As mentioned above, Vread can be lower than VDD (e.g., by 30-70%) and the optimal level for Vread can be predetermined depending upon the type of NVM in the cell. Additionally, the sense node 135 can be pre-charged to the high voltage level (e.g., VDD) (see FIG. 7). To accomplish pre-charging of the sense node 135, the reset signal (RST) applied to the gate of the reset transistor 132 can be switched from the high voltage level (e.g., VDD) to the low voltage level (e.g., to 0 volts) so as to turn on the reset transistor 132, thereby pulling up the voltage level on the sense node 135. During this sense node pre-charge operation, the specific wordline 123 connected to the gate of the select transistor 150 (which is an NFET) can be maintained at the low voltage level (e.g., at 0 volts) such that the select transistor 150 remains off. Once the sense node 135 is pre-charged, RST can be switched back to the high voltage level so as to turn off the reset transistor 132 and a light sensing operation can be performed by the pixel 130. That is, the photodiode 131 can be exposed to light in order to perform a light sensing process, resulting in a second data value being output on the sense node 135 (see FIG. 8). Specifically, an analog light intensity value sensed by the photodiode 131 is represented by a voltage signal that is output on the sense node 135 and, thereby applied to the gate of the amplifying transistor 133. The specific wordline 123 for the specific row connected to the specific cell can be activated (i.e., switched from the low voltage level to the high voltage level), thereby turning on the select transistor 150 of the specific cell 101. In this case, flow of current between the adjustable second voltage rail 139 and the specific bitline 121 is again enabled and a given electric parameter on the specific bitline 121 (e.g., bitline voltage or bitline current) can be sensed (e.g., using the TIA 180 connected to the specific bitline). Any change in this given electrical parameter (e.g., as indicated by the output of the TIA 180) in response to the functional computing process steps will be based on both the first data value, which is stored in the two-terminal NVM device 140 of the specific cell 101 and the second data value, which was output on the sense node 135 of the specific cell 101 and, more specifically, will be indicative of the product of the first data value and the second data value.

Figure 9:
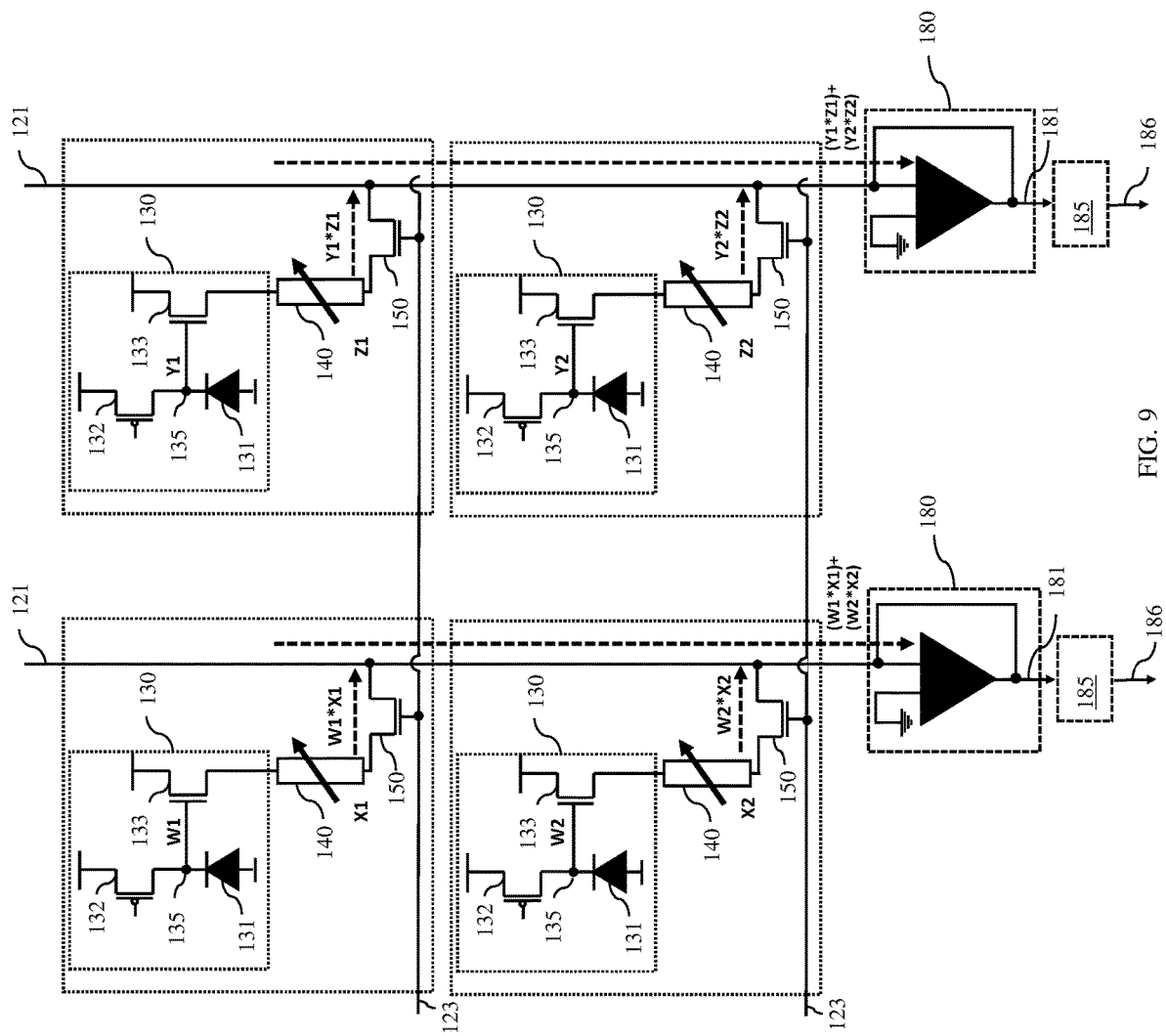
FIG. 9 is a schematic diagram illustrating an array of integrated pixel and two-terminal non-volatile memory (NVM) cell and functional computing operations being concurrently performed by multiple cells in each column.

Optionally, multiple cells in multiple columns and rows can be concurrently operated in the functional computing mode for a cognitive computing operation (e.g., during computation of a cognitive neural network (NN). In this case, all of the cells in all of the columns and rows could be concurrently operated in the functional computing mode or some lesser number of cells in the columns or rows could be concurrently operated in the functional computing mode. For illustration purposes, FIG. 9 shows concurrent operation of four cells in the functional computing mode and, specifically, two per column and two per row. To perform such a cognitive computing operation, binary weight values for the cognitive computing operation can be stored (as the first data values) in the two-terminal NVM devices 140 of the cells 101. The first data values stored in the two-terminal NVM devices 140 of the cells 101 in the first column are represented by X1 and X2, respectively. The first data values stored in the two-terminal NVM devices 140 in the cells 101 in the second column are represented by Z1 and Z2, respectively. The bitlines 121 for the columns can be connected to ground and the adjustable second voltage rail 139 can be set at the read voltage (Vread) level. Additionally, the sense nodes 135 of the pixels 130 in the cells 101 can be concurrently pre-charged. That is, the RST signal applied to the gates of the reset transistors 132 in the multiple cells 101 can be switched to the low voltage level, thereby turning on those reset transistors 132 and pulling up the sense nodes 135 in the cells to the high voltage level. Once the sense nodes 135 are pre-charged, the RST signal can be switched back to the high voltage level, turning off the reset transistors 132. Next, the photodiodes 131 of the pixels 130 in the cells 101 can be exposed to light in order to perform light sensing processes, which result in second data values being output on the sense nodes 135 of the cells. Specifically, analog light intensity values sensed by the photodiodes 131 are represented by voltage signals (i.e., the second data values) that are output on the sense nodes 135 and, thereby applied to the gates of the amplifying transistors 133. The second data values on the sense nodes 135 of the pixels 130 of the cells 101 in the first column are represented by W1 and W2, respectively. The second data values on the sense nodes 135 of the pixels 130 of the cells 101 in the second column are represented by Y1 and Y2, respectively. These second data values can be the activation values for the cognitive computing operation.

Following the light sensing processes, the wordlines 123 for the rows can be activated (i.e., switched from the low voltage level to the high voltage level), thereby turning on the select transistors 150 of the cells 101. In this case, flow of current between the adjustable second voltage rail 139 and the bitlines 121 through the cells in the columns is enabled and changes in a given electrical parameter (e.g., bitline voltage or bitline current) on each bitline can be sensed (e.g., using the TIAs 180 connected to the bitlines). The total change in a given electrical parameter (e.g., either a bitline voltage or a bitline current) on a specific bitline 121 for a specific column (e.g., as indicated by the output of the TIA 180 for the specific column) in response to multiple cells in the specific column being concurrently operated in the functional computing mode will be based on the first and second data values in each cell of that given column. Specifically, for cognitive computing operations, when multiple cells in the same specific column are concurrently selectively operated in the functional computing mode and, optionally, when parallel processing is performed in multiple columns, the total change in the given electrical parameter on each specific bitline for each specific column in response to multiple cells in the same column concurrently operating in the functional computing mode will be indicative of the result of a dot product computation (i.e., will be indicative of the sum of the products of the first data value and the second data value from each selected cell in the specific column). For example, as illustrated in FIG. 9, the total change in the given electrical parameter (e.g., bitline voltage or bitline current) on the bitline of the first column when the two cells therein are in the functional computing mode will be approximately equal to (W1*X1)+(W2*X2), whereas the total change in the given electrical parameter (e.g., bitline voltage or bitline current) on the bitline of the second column when the two cells therein are in the functional computing mode will be approximately equal to (Y1*Z1)+(Y2*Z2).

It should be understood that the integrated pixel and two-terminal NVM cell 101 shown in FIG. 1 is offered for illustration purposes and are not intended to be limiting. FIGS. 10A-10H are schematic drawings illustrating alternative embodiments for the integrated pixel and two-terminal NVM cell 101A-101H, respectively. These alternative embodiments for the integrated pixel and two-terminal NVM cell 101A-101H, respectively, can include a pixel 130 and a two-terminal NVM device 140 (e.g., a MTJ 140A of FIGS. 2A-2B, a PCM device of FIGS. 3A-3B or a memristor 140C of FIGS. 4A-4B) as described in detail above, but can include minor variations as described in detail below. Any of these alternative embodiments of the integrated pixel and two-terminal NVM cell 101A-101H could replace the cell 101 in the array 110 of FIG. 1.

For example, in some embodiments, the integrated pixel and two-terminal NVM cell could include one or more additional transistors. See FIG. 10A and the integrated pixel and two-terminal NVM cell 101A, which includes a switch 136 (e.g., an additional NFET, also referred to as an isolation FET) between the sense node 135 and the gate of the amplifying transistor 133 to control current flow to the gate of the amplifying transistor until the sensing process by the photodiode is complete. See also FIG. 10B and the integrated pixel and two-terminal NVM cell 101B that includes the switch 136 (described above) and another additional NFET 151, which has both a drain region and a gate electrically connected to the junction between the second terminal of the two-terminal NVM device 140 and the select transistor 150 and which has a source region connected to ground for improved performance.

Figure 10A:
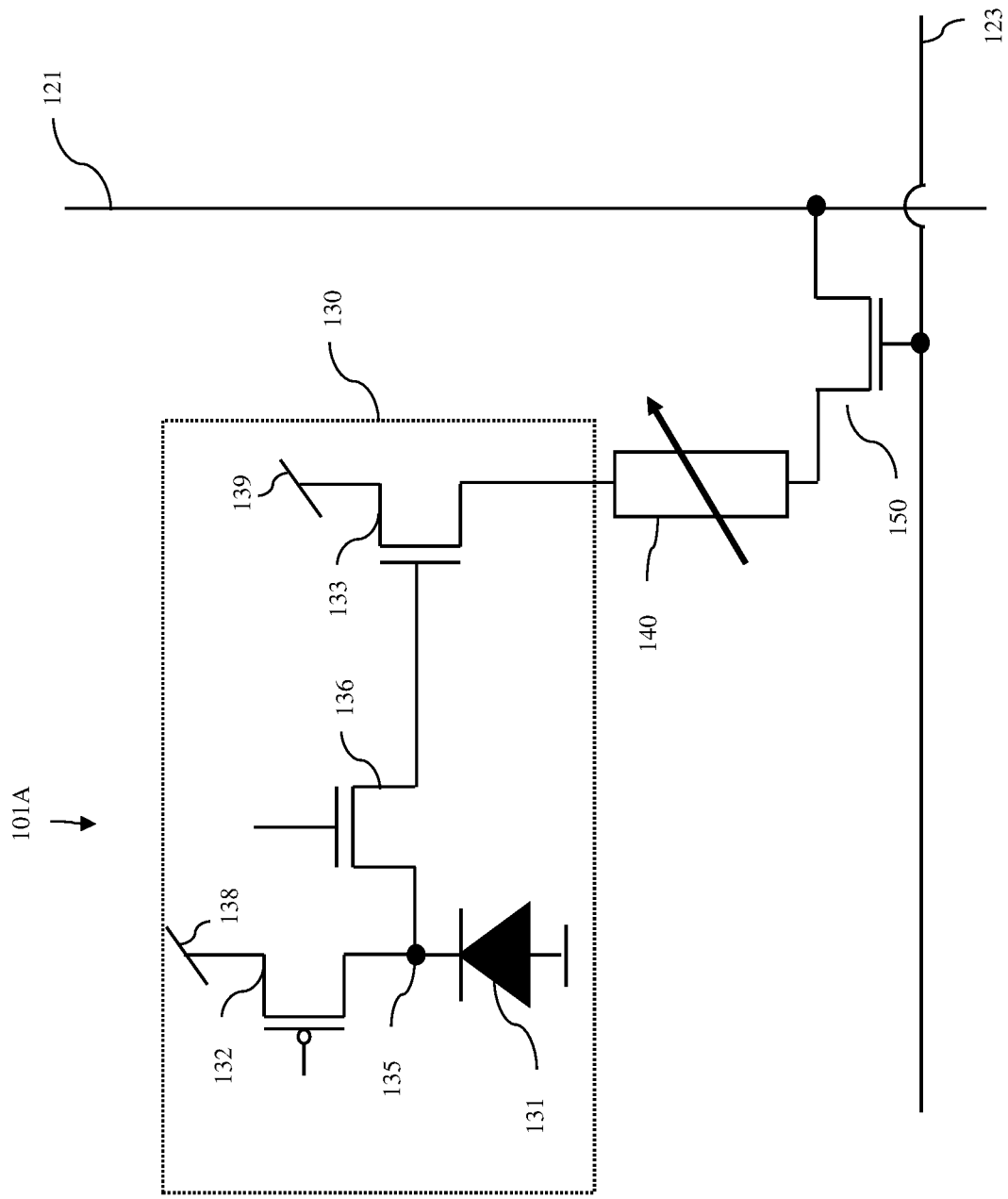
Figure 10B:
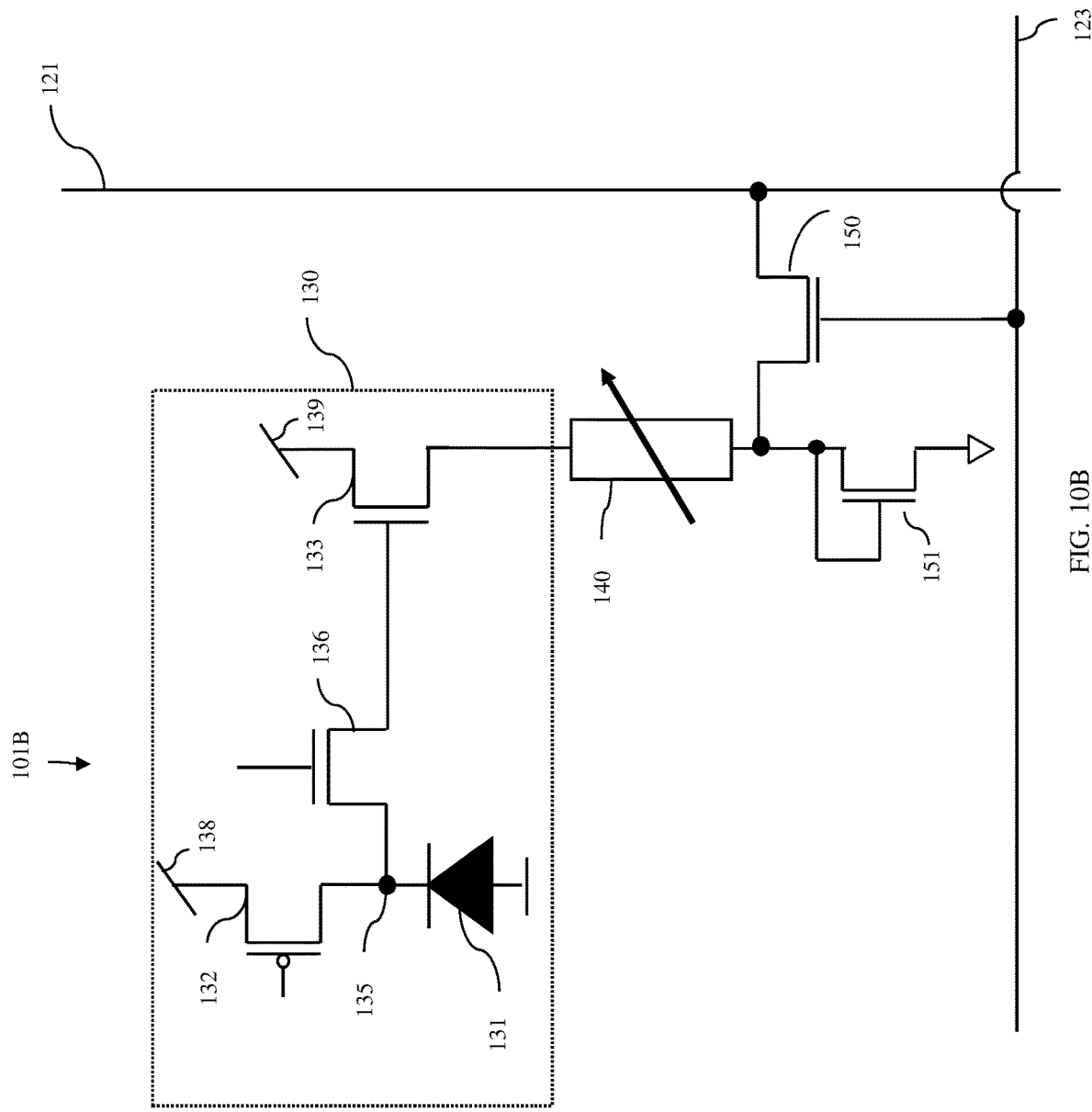
Figure 10C:
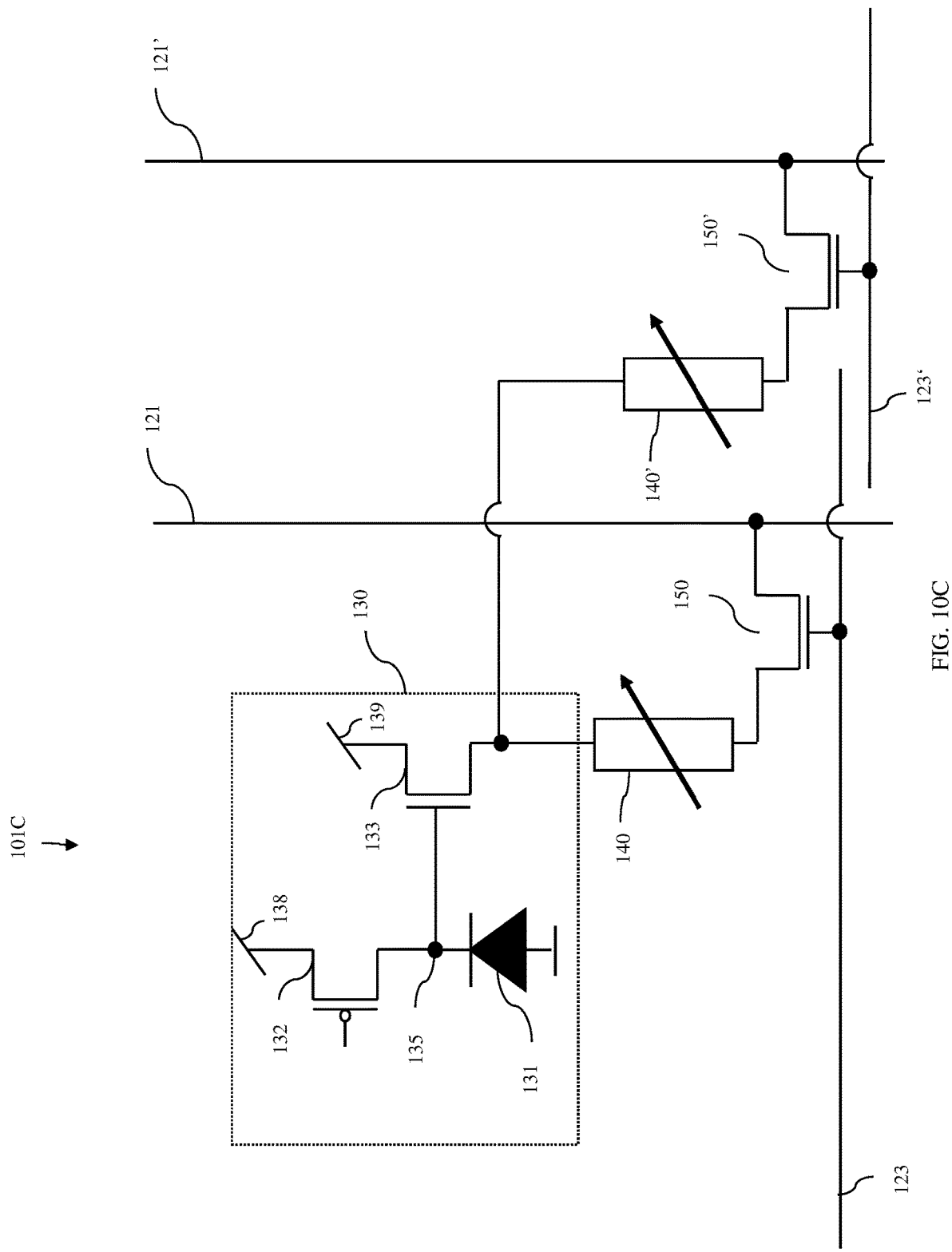
Figure 10D:
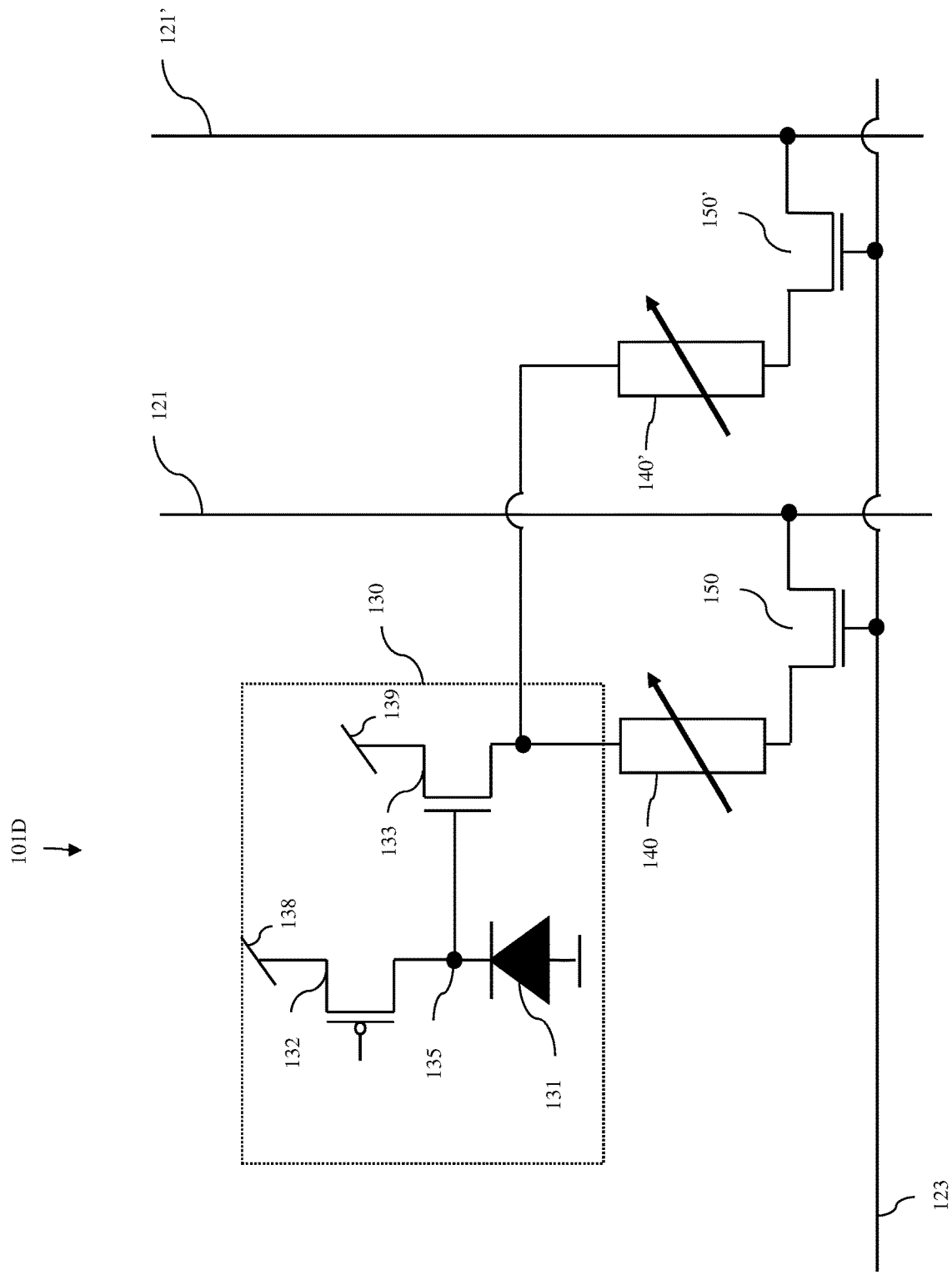
Figure 10E:
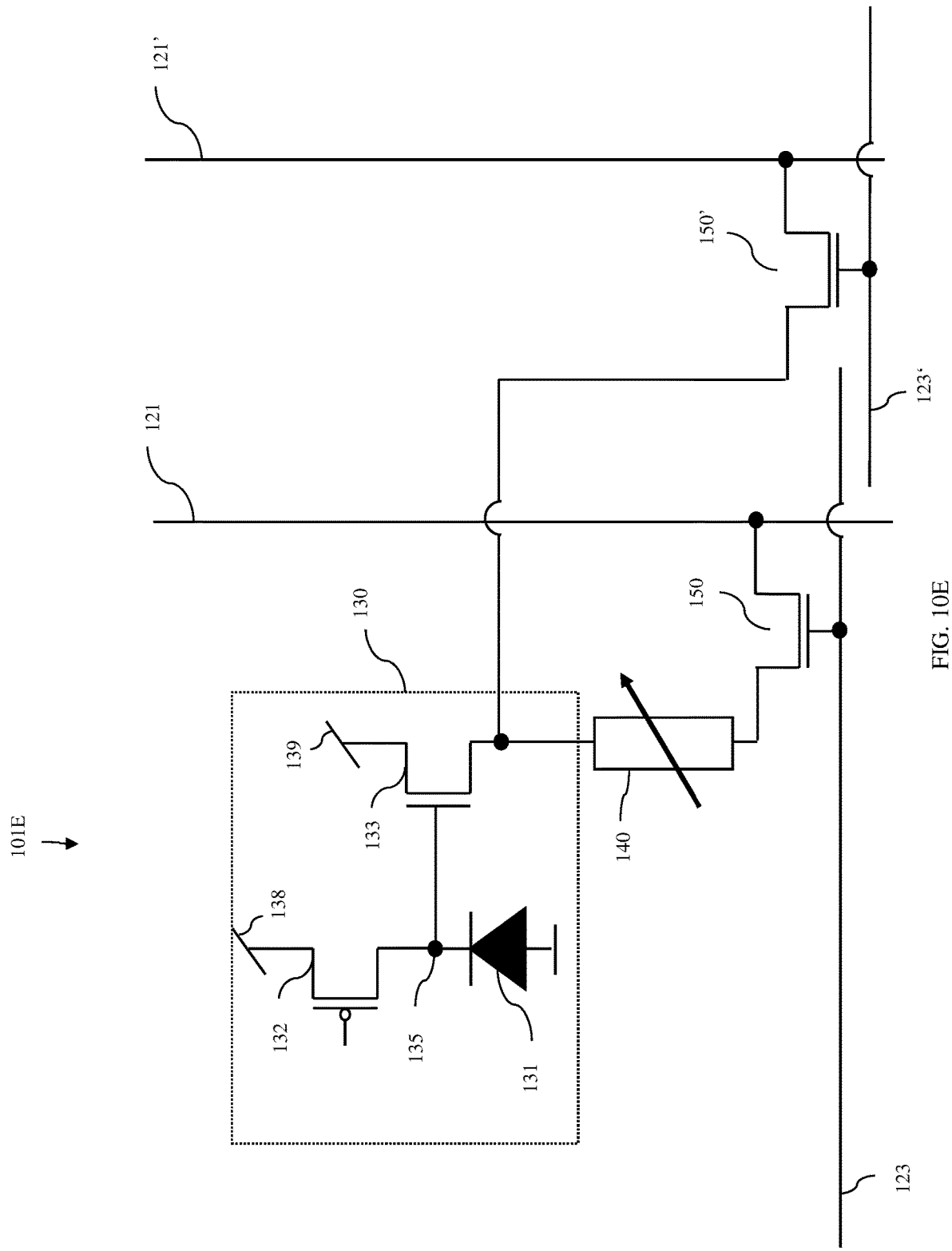
Figure 10F:
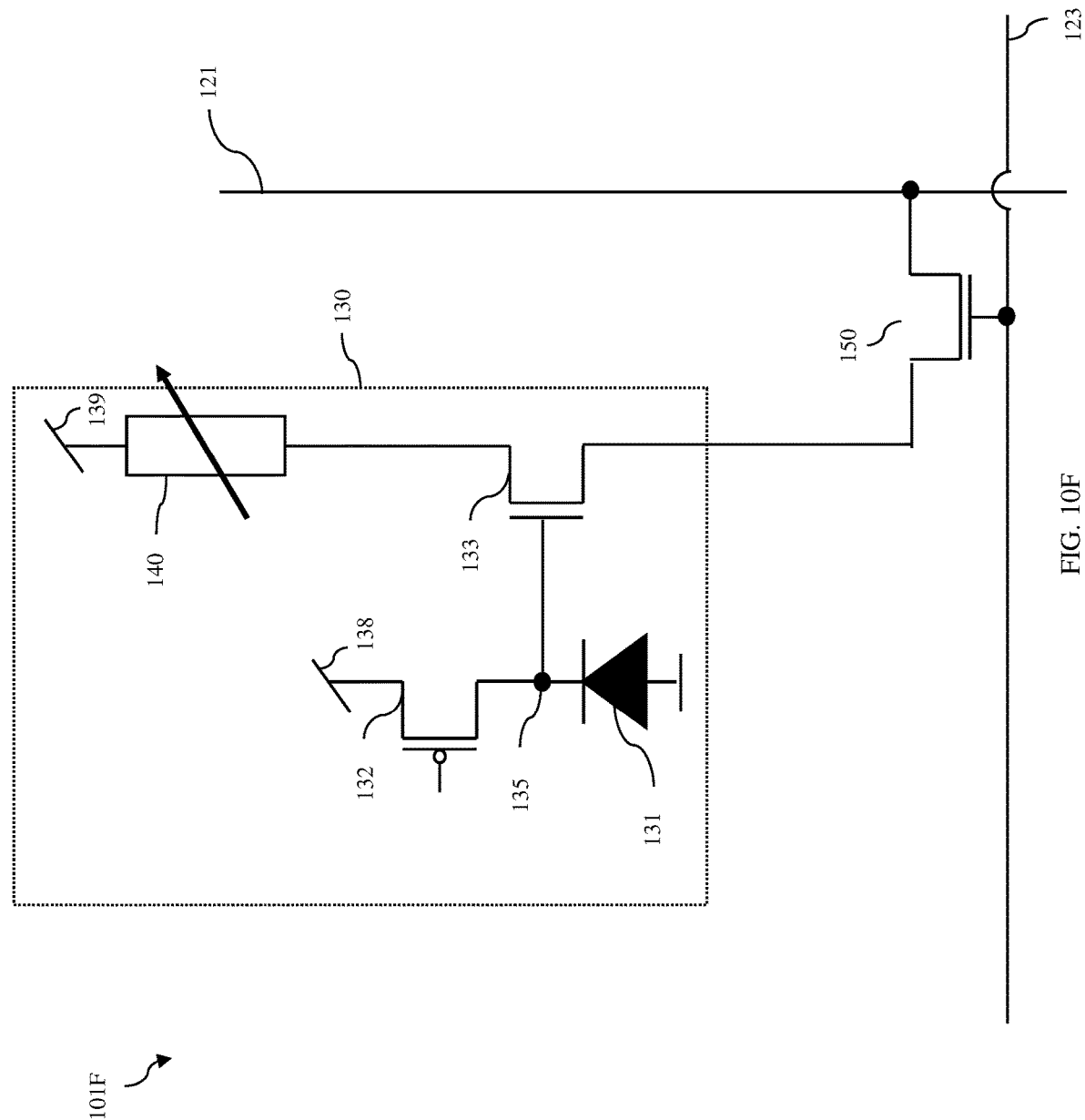
Figure 10G:
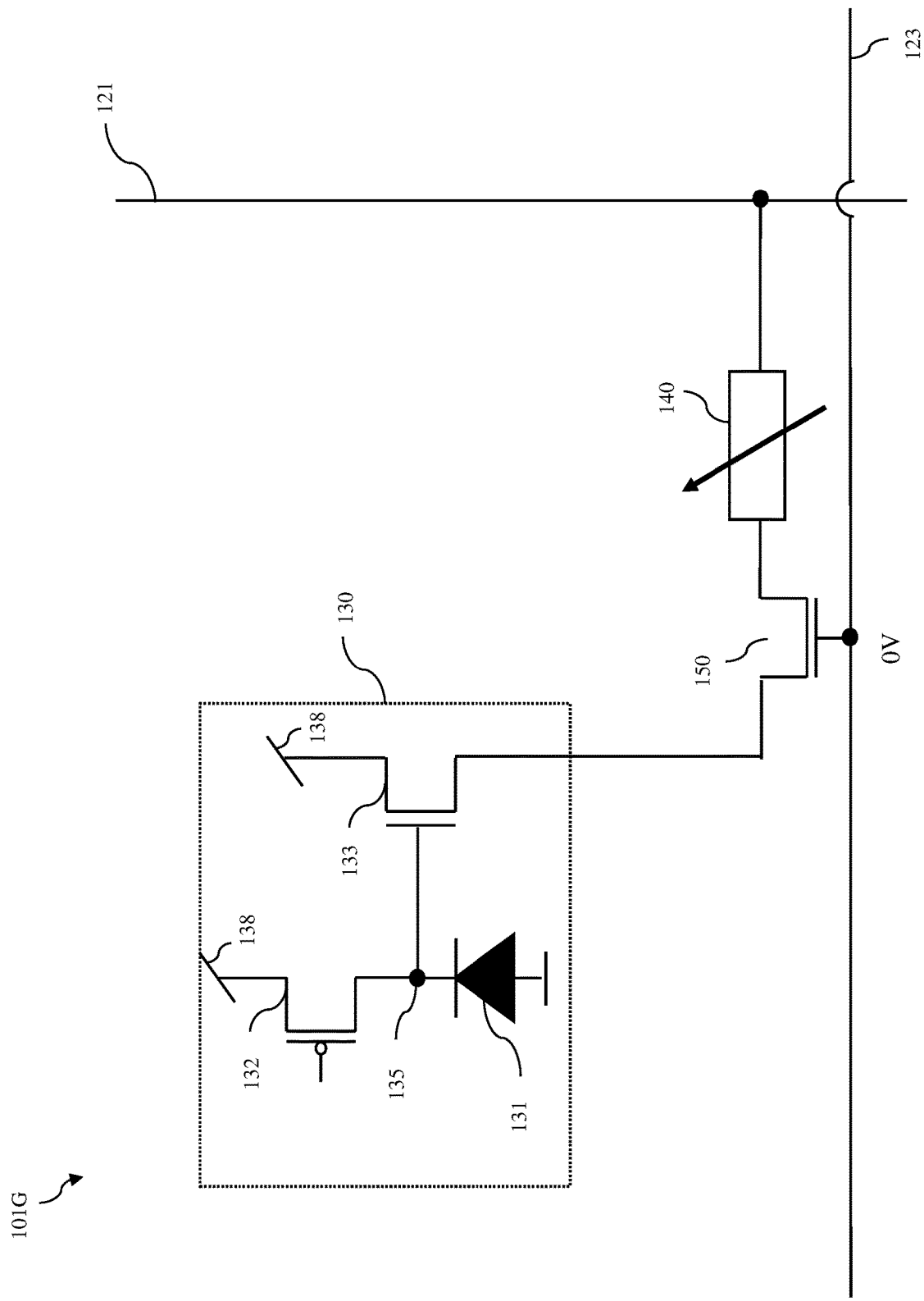

In some embodiments, the integrated pixel and two-terminal NVM cell could also include an additional two-terminal NVM device 140'. See FIG. 10C and the integrated pixel and dual-NVM cell 101C. This integrated pixel and dual-NVM cell 101C includes the pixel 130 and a two-terminal NVM device 140 (as described above) and also includes an additional select transistor 150' and an additional two-terminal NVM device 140'. The additional select transistor 150' can have a source region connected to an additional bitline 121' for the column and a gate connected to an additional wordline 123' for the row. The additional two-terminal NVM device 140' and the additional select transistor 150' can be connected in series between the amplifying transistor 133 of the pixel 130 and the additional bitline 121'. The additional two-terminal NVM device 140' can store an additional first data value. Thus, the integrated pixel and dual-NVM cell 101C can be employed for functional compute operations, where a change in the bitline voltage on one bitline 121 for the column (as indicated by a TIA connected to that bitline) is a function of both the second data value output from the photodiode 131 onto the sense node 135 and the first data value stored on the two-terminal NVM device 140 and where a change in the bitline voltage on the other bitline 121' for the column (as indicated by an additional TIA (not shown) which is connected to that bitline 121') is a function of both the second data value output from the photodiode 131 onto the sense node 135 and the additional first data value stored in the additional two-terminal NVM device 140'. It should be noted that the integrated pixel and dual-NVM cell 101C of FIG. 10C is not intended to be limiting. Other integrated pixel and dual-NVM cells could also be incorporated into an array. For example, see the integrated pixel and dual-NVM cell 101D of FIG. 10D, which is configured essentially the same as the integrated pixel and dual-NVM cell 101C of FIG. 10C except that the same wordline is connected to both the select transistors 150 and 150'. Thus, in the cell 101C of FIG. 10C, write, read and functional computing operations using the different two-terminal NVM devices 140 and 140' can be performed concurrently or selectively because of the two wordlines 123 and 123'. In the cell 101D of FIG. 10D, space is saved by not including the additional wordline 123' but as a result write, read and functional computing operations using the different two-terminal NVM device 140 and 140' are performed concurrently.

In some embodiments, the integrated pixel and two-terminal NVM cell could also include an additional select transistor 150' to enable a pixel-only read operation. See FIG. 10E and the integrated pixel and two-terminal NVM cell 101E. This integrated pixel and two-terminal NVM cell 101E can include an additional select transistor 150' having a source region connected to an additional bitline 121' for the column and a gate connected to an additional wordline 123' for the row. The additional select transistor 150' can be connected in series between the amplifying transistor 133 of the pixel 130 and the additional bitline 121'.

In each of the above-described integrated pixel and two-terminal NVM cell embodiments the two-terminal NVM device 140 is shown as being connected in series between the amplifying transistor 133 and the select transistor 150. In some embodiments, the integrated pixel and two-terminal NVM cell could include a two-terminal NVM device 140 at a different location in the chain between the adjustable second voltage rail 139 and the bitline 121. See FIG. 10F and the integrated pixel and two-terminal NVM cell 101F, wherein the two-terminal NVM device 140 is connected in series between the adjustable second voltage rail 139 and the amplifying transistor 133. Alternatively, see FIG. 10G and the integrated pixel and two-terminal NVM cell 101G, wherein the two-terminal NVM device 140 is connected in series between the select transistor 150 and the bitline 121.

In some embodiments, the conductivity type of one or more of the transistors may be different as compared to in the embodiments descried above. For example, the amplifying transistor 133 of the pixel 130 is described above and illustrated in the drawings as being an NFET; however, alternatively, this amplifying transistor 133 could be a PFET (see FIG. 10H and the integrated pixel and two-terminal NVM cell 101H). Use of PFET instead of an NFET for the amplifying transistor 133 could help to invert the output signal generated by the PFET in response to the voltage accumulated at the sense node 135.

Figure 11:
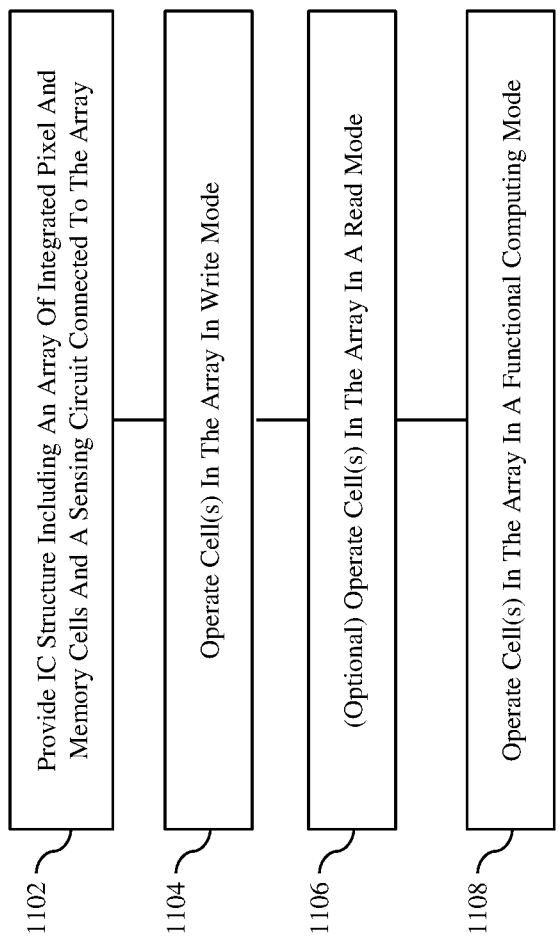
FIG. 11 is a flow diagram illustrating method embodiments for operating an integrated pixel and two-terminal NVM cell and for operating an array of such cells (e.g., to perform deep in-sensor, in-memory computing).

Referring to the flow diagram of FIG. 11, also disclosed herein are associated method embodiments. Specifically, a disclosed method can include providing an integrated circuit (IC) structure 100 (i.e., a processing chip), as described in detail above and illustrated in FIG. 1, that incorporates an array 110 of integrated pixel and two-terminal NVM cells 101 and a sensing circuit connected to the array 110 (see process step 1102).

The method can further include selectively operating the cells in that array in a write mode, a read mode and a functional computing mode (see process steps 1104-1106).

Specifically, referring to FIG. 1 in combination with FIG. 11, operating a specific cell 101 in a specific row and a specific column in a write mode at process step 1104 can include turning on the reset transistor 132 and the select transistor 150 of the specific cell 101 and applying specific bias conditions to the adjustable second voltage rail 139 and thereby to one terminal of the two-terminal NVM device 140 of the specific cell 101 and also to a specific bitline 121 for the specific column and thereby to the other terminal of that two-terminal NVM device 140 in order to store a first data value in the two-terminal NVM device 140. It should be noted that the specific bias conditions will vary depending upon the desired stored data value and on the type and configuration of the two-terminal NVM device. For example, see the detailed discussion of FIGS. 5A and 5B above as well as the discussions of FIGS. 2A-2B, 3A-3B and 4A-4B.

Operating a specific cell 101 in a specific row and a specific column in the read mode at process step 1106 can include connecting a specific bitline for the specific column containing the specific cell to ground (e.g., through a low resistance path) and setting the adjustable second voltage rail 139 at a read voltage (Vread) level. As mentioned above, Vread can be lower than VDD (e.g., by 30-70%) and the optimal level for Vread can be predetermined depending upon the type of NVM in the cell. Then, the reset transistor 132 and the select transistor 150 of the specific cell 101 can be turned on and a given electrical parameter (e.g., a read current (Tread)) on the specific bitline 121 for the specific column can be sensed (e.g., using the TIA 18) in order to determine the first data value stored in the two-terminal NVM device 140 of the cell 101. For example, see the detailed discussion of FIG. 6 above.

Operating a specific cell 101 in a specific row and a specific column in the functional computing mode at process step 1108 can include connecting a specific bitline for the specific column containing the specific cell to ground (e.g., through a low resistance path) and setting the adjustable second voltage rail 139 at the read voltage (Vread) level. As mentioned above, Vread is lower than VDD (e.g., by 30-70%) and the optimal level for Vread can be predetermined depending upon the type of NVM in the cell. Additionally, the sense node 135 of the specific cell 101 can be pre-charged (e.g., to VDD) by turning on the reset transistor 132, while keeping the select transistor 150 turned off. For example, see the detailed discussion of FIG. 7 above. Operating the specific cell 101 in the functional computing mode at process step 1108 can further include: performing a light sensing process, wherein the photodiode 131 of the specific cell 101 is exposed to light resulting in a second data value being output on the sense node 135; turning on the select transistor 150 for the specific cell 101; and sensing any change in a given electrical parameter on the specific bitline 121 (e.g., a bitline voltage or a bitline current) (e.g., using the TIA 180). See the detailed discussion of FIG. 8 above. Change in the given electrical parameter on the specific bitline 121 in response to the above-described functional computing process steps in a specific cell will be indicative of a product of the first data value stored in the two-terminal NVM device 140 and the second data value captured by the photodiode 131 and output on the sense node 135 within the specific cell 101. Furthermore, a total change in this given electrical parameter on the specific bitline in response to multiple cells in the same specific column concurrently operating in the functional computing mode will be indicative of a result of a dot product computation. See the detailed discussion of FIG. 9 above. Thus, the method can be employed for deep in-sensor, in-memory computing of applications that require dot product computations (e.g., for deep in-sensor, in-memory computing of neural networks).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated pixel and memory cell comprising:
a select transistor;
a two-terminal non-volatile memory device; and
a pixel comprising:
  a reset transistor connected to a first voltage rail;
  a photodiode connected in series with the reset transistor;
  a sense node at a junction between the reset transistor and the photodiode; and
  an amplifying transistor connected in series with the two-terminal non-volatile memory device and the select transistor between a second voltage rail that is different from the first voltage rail and a bitline, wherein the amplifying transistor has a gate electrically connected to the sense node.

2. The integrated pixel and memory cell of claim 1, wherein the two-terminal non-volatile memory device comprises any of a magnetic tunnel junction device, a phase change memory device, and a memristor.

3. The integrated pixel and memory cell of claim 1,
wherein the cell is selectively operable in a write mode, a read mode and a functional computing mode,
wherein, during the write mode, a first data value is stored in the two-terminal non-volatile memory device, and
wherein, during the functional computing mode, the photodiode performs a light sensing process resulting in a second data value on the sense node and a combined data value that is a function of the first data value and the second data value read from the cell.

4. The integrated pixel and memory cell of claim 1, wherein the second voltage rail comprises an adjustable voltage rail and wherein the two-terminal non-volatile memory device is in series between any of the following:
the amplifying transistor and the select transistor;
the second voltage rail and the amplifying transistor; and
the select transistor and the bitline.

5. The integrated pixel and memory cell of claim 1, further comprising a switch that selectively electrically connects the gate of the amplifying transistor to the sense node.

6. The integrated pixel and memory cell of claim 1,
wherein the two-terminal non-volatile memory device comprises a first terminal connected to the amplifying transistor and a second terminal connected to the select transistor, and
wherein each cell further comprises an additional transistor connected to the second terminal.

7. The integrated pixel and memory cell of claim 1,
wherein the bitline is for a column in an array of integrated pixel and memory cells, and
wherein a gate of the select transistor is connected to a wordline for a row in the array.

8. The integrated pixel and memory cell of claim 7, further comprising an additional non-volatile memory device and an additional select transistor connected in series between the amplifying transistor and an additional bitline for the column, wherein a gate of the additional select transistor is connected to an additional wordline for the row.

9. The integrated pixel and memory cell of claim 7, further comprising an additional non-volatile memory device and an additional select transistor connected in series between the amplifying transistor and an additional bitline for the column, wherein a gate of the additional select transistor is connected the wordline for the row.

10. The integrated pixel and memory cell of claim 7, further comprising an additional select transistor connected in series between the amplifying transistor and an additional bitline for the column, wherein a gate of the additional select transistor is connected to an additional wordline for the row.

11. An integrated circuit structure comprising:
an array of integrated pixel and two-terminal non-volatile memory cells;
bitlines connected to columns of the cells in the array; and
wordlines connected to rows of cells in the array,
wherein each cell comprises:
  a select transistor having a gate electrically connected to a wordline for a row;
  a two-terminal non-volatile memory device; and
  a pixel comprising:
    a reset transistor;
    a photodiode, wherein the reset transistor is connected in series between a first voltage rail and the photodiode;
    a sense node at a junction between the reset transistor and the photodiode; and
    an amplifying transistor, wherein the amplifying transistor the two-terminal non-volatile memory device and the select transistor are connected in series between an adjustable second voltage rail and a bitline for a column and wherein the amplifying transistor has a gate electrically connected to the sense node.

12. The integrated circuit structure of claim 11, wherein the two-terminal non-volatile memory device comprises any of a magnetic tunnel junction, a phase change memory device, and a memristor.

13. The integrated circuit structure of claim 11, further comprising a sensing circuit comprising transimpedance amplifiers for the columns, respectively, wherein each specific transimpedance amplifier for each specific column has a first input electrically connected to ground, a second input electrically connected to a specific bitline of the specific column and an output electrically connected to the specific bitline for the specific column.

14. The integrated circuit structure of claim 13, the sensing circuit further comprising analog-to-digital converters for the columns, respectively, wherein each specific analog-to-digital converter for each specific column is electrically connected to the output of the specific transimpedance amplifier.

15. The integrated circuit structure of claim 11,
wherein the cells are selectively operable in a write mode, a read mode and a functional computing mode,
wherein, during the write mode in a specific cell in a specific row and a specific column, the reset transistor and the select transistor of the specific cell are turned on and specific bias conditions are applied to the adjustable second voltage rail and to a specific bitline for the specific column in order to store a first data value in the two-terminal non-volatile memory device of the specific cell,
wherein, during the functional computing mode in the specific cell,
the sense node of the specific cell is pre-charge,
a light sensing process is performed, wherein the photodiode of the pixel of the specific cell is exposed to light resulting in a second data value on the sense node,
following the light sensing process, the select transistor is turned on, and
a given electrical parameter is sensed on the specific bitline for the specific column,
wherein any change in the given electrical parameter on the specific bitline is indicative of a product of the first data value and the second data value in the specific cell, and
wherein a total change in the given electrical parameter on the specific bitline when multiple cells in the specific column concurrently operate in the functional computing mode is indicative of a result of a dot product computation.

16. The integrated circuit structure of claim 15, wherein the given electrical parameter comprises any of a bitline voltage and a bitline current of the specific bitline.

17. A method comprising:
operating integrated pixel and two-terminal non-volatile memory cells in an array of the cells,
wherein an integrated circuit structure comprises: the array of the cells; bitlines connected to columns of the cells in the array; and wordlines connected to rows of cells in the array,
wherein each cell in the array comprises:
a select transistor having a gate electrically connected to a wordline for a row;
a two-terminal non-volatile memory device; and
a pixel comprising:
a reset transistor;
a photodiode, wherein the reset transistor is connected in series between a first voltage rail and the photodiode;
a sense node at a junction between the reset transistor and the photodiode; and
an amplifying transistor, wherein the amplifying transistor, the two-terminal non-volatile memory device, and the select transistor are connected in series between an adjustable second voltage rail and a bitline for a column and wherein the amplifying transistor has a gate electrically connected to the sense node, and
wherein the operating comprises operating the cells in the array in any of a write mode, a read mode, and a functional computing mode.

18. The method of claim 17, wherein the two-terminal non-volatile memory device comprises any of a magnetic tunnel junction device, a phase change memory device, and a memristor.

19. The method of claim 17, further comprising operating a specific cell in a specific row and a specific column in the write mode, wherein the operating of the specific cell in the specific row and the specific column in the write mode comprises:
turning on the reset transistor and the select transistor of the specific cell; and
applying specific bias conditions to the adjustable second voltage rail and to a specific bitline for the specific column in order to store a first data value in the two-terminal non-volatile memory device of the specific cell.

20. The method of claim 17, further comprising operating a specific cell in a specific row and a specific column in the functional computing mode, wherein the operating of the specific cell in the specific row and the specific column in the functional computing mode comprises:
pre-charging a sense node of the specific cell;
performing a light sensing operation, wherein the photodiode of the pixel of the specific cell is exposed to light resulting in a second data value on the sense node;
turning on the select transistor; and
sensing a given electrical parameter on a specific bitline for the specific column,
wherein the given electrical parameter comprises any of a bitline voltage and a bitline current,
wherein any change in the given electrical parameter on the specific bitline is indicative of a product of a first data value stored in the two-terminal non-volatile memory device of the specific cell and the second data value on the sense node of the specific cell, and
wherein a total change the given electrical parameter in response to multiple cells in the specific column concurrently operating in the functional computing mode is indicative of a result of a dot product computation.

* * * * *